United States Patent
Bechtel et al.

(10) Patent No.: US 6,679,608 B2
(45) Date of Patent: Jan. 20, 2004

(54) SENSOR DEVICE HAVING AN INTEGRAL ANAMORPHIC LENS

(75) Inventors: Jon H. Bechtel, Holland, MI (US); Harold C. Ockerse, Holland, MI (US); John K. Roberts, East Grand Rapids, MI (US)

(73) Assignee: Gentex Corporation, Zeeland, MI (US)

( * ) Notice: Subject to any disclaimer, the term of this patent is extended or adjusted under 35 U.S.C. 154(b) by 156 days.

(21) Appl. No.: 10/043,977

(22) Filed: Jan. 10, 2002

(65) Prior Publication Data

US 2002/0056806 A1 May 16, 2002

Related U.S. Application Data

(63) Continuation-in-part of application No. 09/491,192, filed on Jan. 25, 2000, now Pat. No. 6,379,013, which is a continuation-in-part of application No. 09/236,969, filed on Jan. 25, 1999, now abandoned.

(51) Int. Cl.[7] .............................................. G02B 17/00
(52) U.S. Cl. .................. 359/604; 359/605; 359/601; 359/602
(58) Field of Search ................................ 359/604, 605, 359/601, 602, 608; 250/208.1, 227.25, 339, 341.7

(56) References Cited

U.S. PATENT DOCUMENTS

| | | | | |
|---|---|---|---|---|
| 3,749,477 A | * | 7/1973 | Willoughby et al. | 359/671 |
| 4,684,222 A | * | 8/1987 | Borrelli et al. | 359/671 |
| 5,105,207 A | * | 4/1992 | Nelson | 347/131 |
| 5,760,962 A | * | 6/1998 | Schofield et al. | 359/604 |
| 5,841,177 A | | 11/1998 | Komoto et al. | |
| 5,869,883 A | | 2/1999 | Mehringer et al. | |
| 5,923,027 A | * | 7/1999 | Stam et al. | 250/208.1 |
| 6,097,023 A | * | 8/2000 | Schofield et al. | 250/208.1 |
| 6,359,274 B1 | | 3/2002 | Nixon et al. | |
| 6,379,013 B1 | * | 4/2002 | Bechtel et al. | 359/604 |
| 6,441,886 B2 | * | 8/2002 | Suzuki et al. | 355/71 |

* cited by examiner

*Primary Examiner*—Mohammad Sikder
(74) *Attorney, Agent, or Firm*—Price, Heneveld, Cooper, DeWitt & Litton

(57) ABSTRACT

The inventive sensor device provides different fields of view in transverse directions. The sensor device include a support structure, a sensing element mounted on the support substrate for sensing optical radiation and generating an electrical output signal in response thereto, and an encapsulant encapsulating the sensing element on the support structure. The encapsulant includes an integral anamorphic lens. Alternatively or additionally, the encapsulant may have at least a first zone and a second zone, where the second zone exhibits at least one different characteristic from the first zone, such as a different optical, physical, thermal, or compositional characteristic.

66 Claims, 15 Drawing Sheets

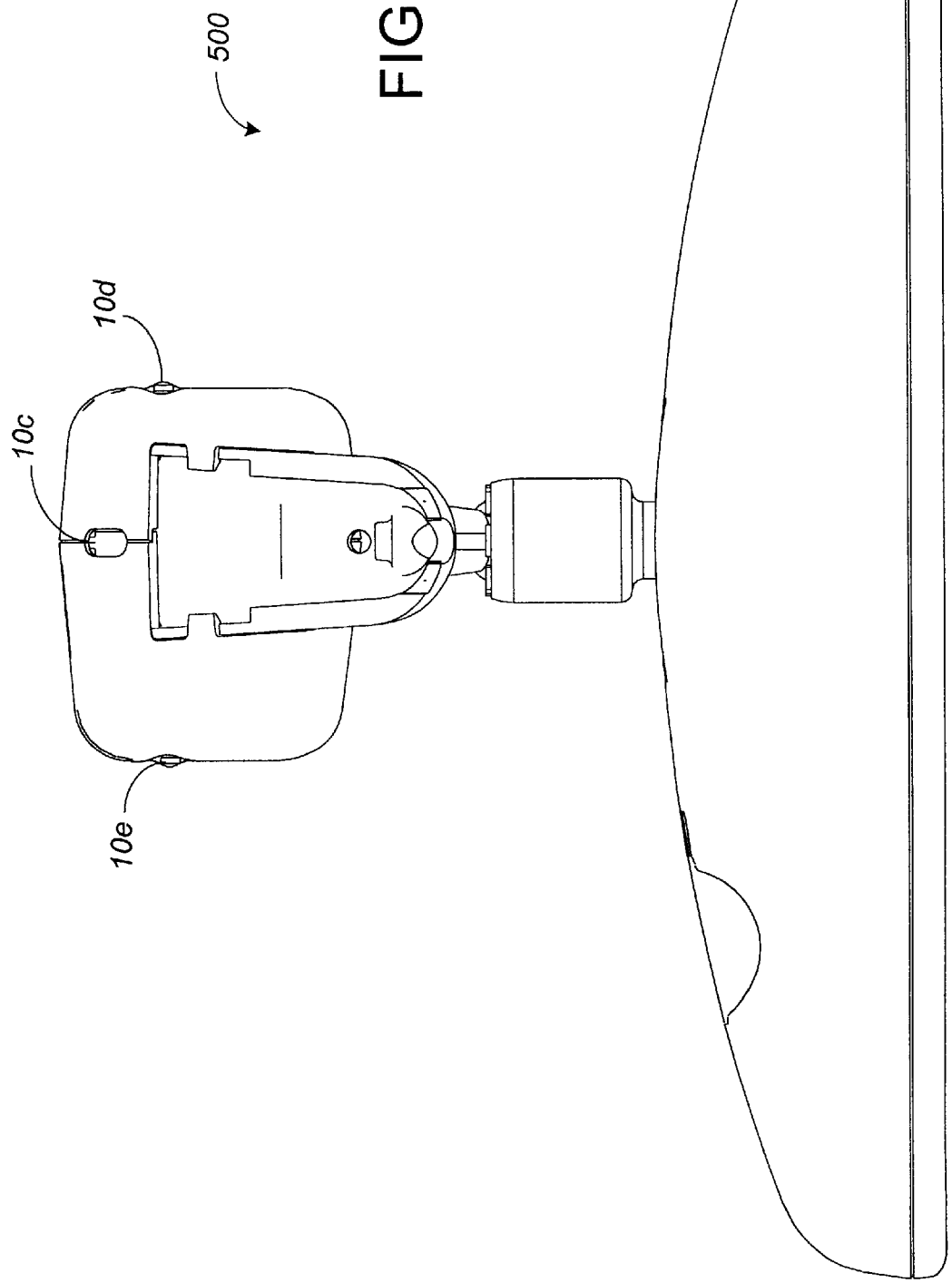

SENSOR DEVICE HAVING AN INTEGRAL ANAMORPHIC LENS

CROSS-REFERENCE TO RELATED APPLICATIONS

This application is a continuation-in-part of U.S. patent application Ser. No. 09/491,192 filed on Jan. 25, 2000, by Jon H. Bechtel et al. entitled "VEHICLE EQUIPMENT CONTROL WITH SEMICONDUCTOR LIGHT SENSOR," now U.S. Pat. No. 6,379,013,which is a continuation-in-part of U.S. patent application Ser. No. 09/236,969 filed on Jan. 25, 1999 now abandoned, by Jon H. Bechtel et al. entitled "AUTOMATIC DIMMING MIRROR USING SEMICONDUCTOR LIGHT SENSOR WITH INTEGRAL CHARGE COLLECTION." The disclosures of each of the above applications are incorporated herein by reference in their entirety.

BACKGROUND OF THE INVENTION

The present invention generally relates to an optical radiation sensor device, and more particularly to a sensor device incorporating a photosensor.

Lignt sensors are used in a large number of different applications. In such light sensing applications, several characteristics of the sensing mechanism need to be in acceptable ranges and some further need to be characterized for specific light sensing applications. Other characteristics of the sensor may increase the range of applications for which the sensor is suitable and/or may provide for easier or more economical design applications. One characteristic for which general requirements vary significantly from one application to another is the angular response characteristic, i.e., the angular response profile, of the sensor which is needed for the particular application. A second characteristic is the optical gain, which for low light level measurements is preferably high enough to make stable measurements of the lowest light levels which need to be detected by the system.

Sensor devices of the type used to detect light are constructed in a variety of packages. For example, photoresistive sensors are often mounted on a circuit board with or without a separate lens positioned in front of the sensor. Some photodiodes have been constructed in which the sensor die is mounted to a lead frame and is encapsulated by a clear epoxy. A portion of the epoxy encapsulant is molded into a lens so as to focus incident light onto the sensor die. Such lenses have been either spherical or other surfaces of revolution that are symmetric about an axis which is generally perpendicular to the surface of the active sensing element. Additionally, these lenses exhibit a single focal length. Unlike a sensor construction in which a separate lens is spaced from the sensor, the lens in these types of sensor devices is an integral part of the sensor and the space separating the sensor and the lens has been eliminated. The main design difference which results from filling the space between the lens and the sensor with plastic is that the speed of propagation of the light rays is reduced being inversely proportional to the index of refraction of the lens material. This effectively increases the focal length of the lens in proportion to the index of refraction of the material.

For certain applications, it is desired to have a field of view which is different in one direction than in the transverse direction. One such application is a headlamp control system in which vehicle headlamps are turned on and off in response to a sensed ambient light level. U.S. Pat. No. 6,243,002 issued to Hill et al. discloses a headlamp control system in which the vertical field of view of a sensor is different from the horizontal field of view. These different fields of view are obtained by providing a field-defining channel in the housing in which the sensor is mounted. Such a configuration, however, requires the channel, and hence the housing, to have significant depth, and that the sensor be mounted within the housing spaced away from the outer surface of the housing by an amount equal to at least the depth of the channel. If the aforementioned sensor device having a lead frame is utilized, the circuit board on which the sensor device is mounted would need to be spaced all the farther away from the surface of the housing to accommodate a significant portion of the length of the sensor device and the depth of the channel.

It is also desirable to make the sensor device as small as possible for certain applications, such as when the sensor is incorporated in a rearview mirror assembly for use in controlling vehicle headlamps, windshield wipers, or controlling an electrochromic mirror element provided in the rearview mirror assembly. Present photosensors generally have active sensing areas in the range of 1 mm$^2$ to 100 mm$^2$. To provide such large photosensors in a mirror assembly or other device, relatively large apertures need to be provided in the housing of the structure in which the sensor is provided. Despite the desirability for decreasing the size of the photosensor, one cannot arbitrarily decrease the size of the active sensing area of the photosensor because the photosensor then becomes subject to problems associated with lens defects that can cause shadowing to occur. Further, using such a small detector reduces the optical gain and the angular response of the sensor. When a very small sensing element is utilized in combination with a lens where the sensing element placed at the lens focus, the sensing element can only sense light that impinges on the lens on-axis, and is almost blind to all off-axis light.

Accordingly, there exists a need for a smaller photosensor device that exhibits optical gain and an angular response approaching or exceeding that of larger photosensors. Also, there exists the need for a sensor device construction that provides different fields of view in transverse directions without requiring a channel to restrict the field of view.

SUMMARY OF THE INVENTION

Accordingly, it is an aspect of the present invention to provide a sensor device providing different fields of view in transverse directions. To achieve this and other aspects and advantages, a sensor device of the present invention comprises a support structure; a sensing element mounted on the support substrate for sensing optical radiation and generating an electrical output signal in response thereto; and an encapsulant encapsulating the sensing element on the support structure, the encapsulant including an integral anamorphic lens.

According to another aspect of the present invention, a sensor device comprises a support structure; a sensing element mounted on the support structure for sensing optical radiation and generating an electrical signal in response thereto; and an encapsulant encapsulating the sensing element on the support structure, the encapsulant including an integral lens for directing incident optical radiation towards the sensing element, the lens presenting different fields of view to the sensing element for transverse directions.

According to yet another aspect of the present invention, a vehicle accessory for mounting in a vehicle is provided that comprises a sensor device comprising a support structure; a sensing element mounted on the support structure for sensing optical radiation and generating an electrical output in response thereto; and an encapsulant encapsulating the sensing element on the support structure, the encapsulant including an integral anamorphic lens.

According to another aspect of the invention, a sensor device comprises a support structure; a sensing element mounted on the support structure for sensing optical radiation and generating an electrical output in response thereto; and an encapsulant encapsulating the sensing element on the support structure, the encapsulant including an integral lens for directing incident optical radiation toward the sensing element, the lens having different focal lengths for transverse directions.

According to another aspect of the present invention, a sensor device comprises a support structure; a sensing element mounted on the support structure for sensing optical radiation and generating an electrical output in response thereto; and an integral encapsulant configured to encapsulate the sensing element on the support structure, the encapsulant having at least a first zone and a second zone, the second zone exhibiting at least one different characteristic from the first zone.

These and other features, advantages, and objects of the present invention will be further understood and appreciated by those skilled in the art by reference to the following specification, claims, and appended drawings.

BRIEF DESCRIPTION OF THE DRAWINGS

In the drawings:

FIG. 10C is a top plan view of the rear of a rearview mirror assembly incorporating the sensor device of the present invention;

DETAILED DESCRIPTION OF THE PREFERRED EMBODIMENTS

Figure 1:
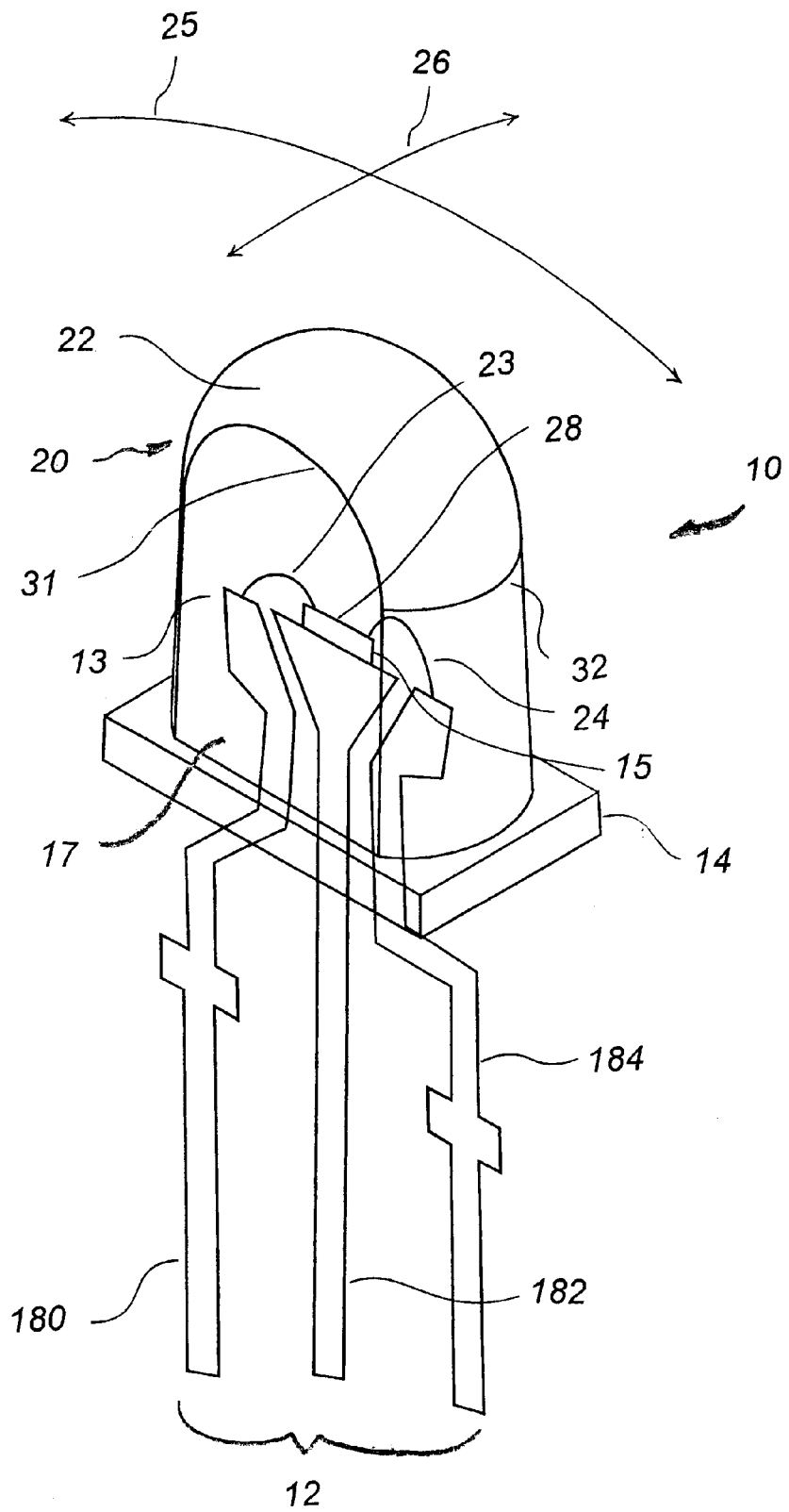
FIG. 1 is a perspective view of a sensor device constructed in accordance with a first embodiment of the present invention.

Reference will now be made in detail to the present preferred embodiments of the invention, examples of which are illustrated in the accompanying drawings. Wherever possible, the same reference numerals will be used throughout the drawings to refer to the same or like parts.

A sensor device constructed in accordance with a first embodiment of the present invention is shown in FIG. 1. The sensor device 10 includes a support structure, such as a printed circuit board or a lead frame 12, a sensing element 15 mounted on the support substrate for sensing optical radiation, preferably visible light, and an encapsulant 17 encapsulating the sensing element on the support structure. In general, the encapsulant 17 includes an integral lens 20 having an anamorphic surface 22 to provide for different fields of view in transverse directions. According to the first embodiment, the anamorphic surface 22 is bi-radial. For example, the design may be for a field of view of nominally 90 degrees included angle in the direction 25 and nominally 45 degrees included angle in the direction 26. For example, the toroidal having a radius of 1.5 mm in the direction indicated by 32 and the larger radii depicted by 31 may be generated by sweeping the center of the curve 32 about an arc having a 1 mm radius. The lens formed by the toroidal surface 22 has a focal length of roughly 4.5 mm in the plane which intersects the lens along its smaller radius and a focal length of roughly 7.5 mm in the plane which intersects the lens along its largest radius. The active sensing area 28 of sensing element 15 is small (i.e., having a surface area of less than 1 mm$^2$) and is centrally located on the top surface of sensing element 15. Preferably, the active sensing area 28 has a diameter of, for example, 100 microns and an area of about 0.03 mm$^2$. The surface 22 may be of many forms and does not need to be toroidal. For example, the curve 32 may be any aspheric shape, perhaps optimized for some aspect of lens performance. Then, the shape 32 may optionally be rotated to form a surface of revolution in the other direction as with the toroidal surface 22 or may be swept along some other curve. In a more general case, the surface profile does not even need to be circular in either direction. A surface which meets the intent of the specification of this invention is one which performs the desired function and which has a generally larger radius of curvature as measured at the intersection of a plane which is generally parallel to the direction of the widest field of view. As described further below in connection with the second embodiment of the invention, the integral lens may have a cylindrical surface.

For the lens that has surface profiles which differ in radius in different reference planes, ray fans projected into the lens from within these different planes come into general focus at differing distances from the lens surface. The position of sensing area 28 relative to the various focal distances of the lens has a strong effect on the resulting shape of the sensitivity profile of the sensor response. It is generally preferable to position the active sensing surface 28 as close or closer to the lens than the closest distance of a point for which there is a strong focusing characteristic. In the above-described example, this would be as close or closer than the nominal focal distance of 4.5 mm resulting from the 1.5 mm lens radius. Placement of the sensor surface short of the focal distance has a de-focusing effect which widens the response profile in the reference plane for which the particular focus applies. As the ratio of the distance of the active surface of the sensor from the lens to the focal length of a particular focus point is decreased, the optical gain in the corresponding orientation is generally decreased and the width of the response profile in the corresponding orientation is increased. Since the radius of curvature and the resulting focal length in a plane parallel to the direction 25 is longer than the focal length corresponding to direction 26, the ratio of the distance of the sensor from the lens to the longer focal distance is smaller and the corresponding response profile is wider, but the contribution to the overall optical gain of the sensor though significant is smaller. This is in line with the desire to have the wider response profile in the direction indicated by 25.

Figure 13A:
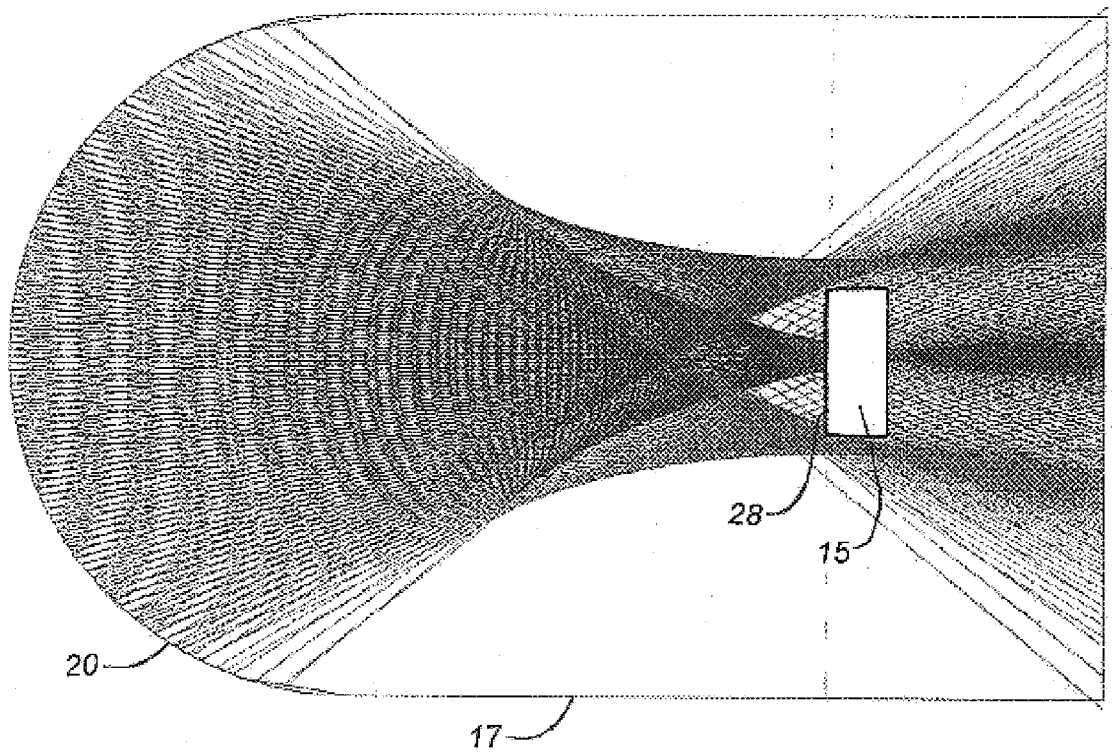
FIGS. 13A and 13B represent two different ray tracings for light incident upon two different photosensors having different lens radii based upon light emitted from an on-axis source and two light sources that are +10 degrees and −10 degrees off-axis.
Figure 13B:
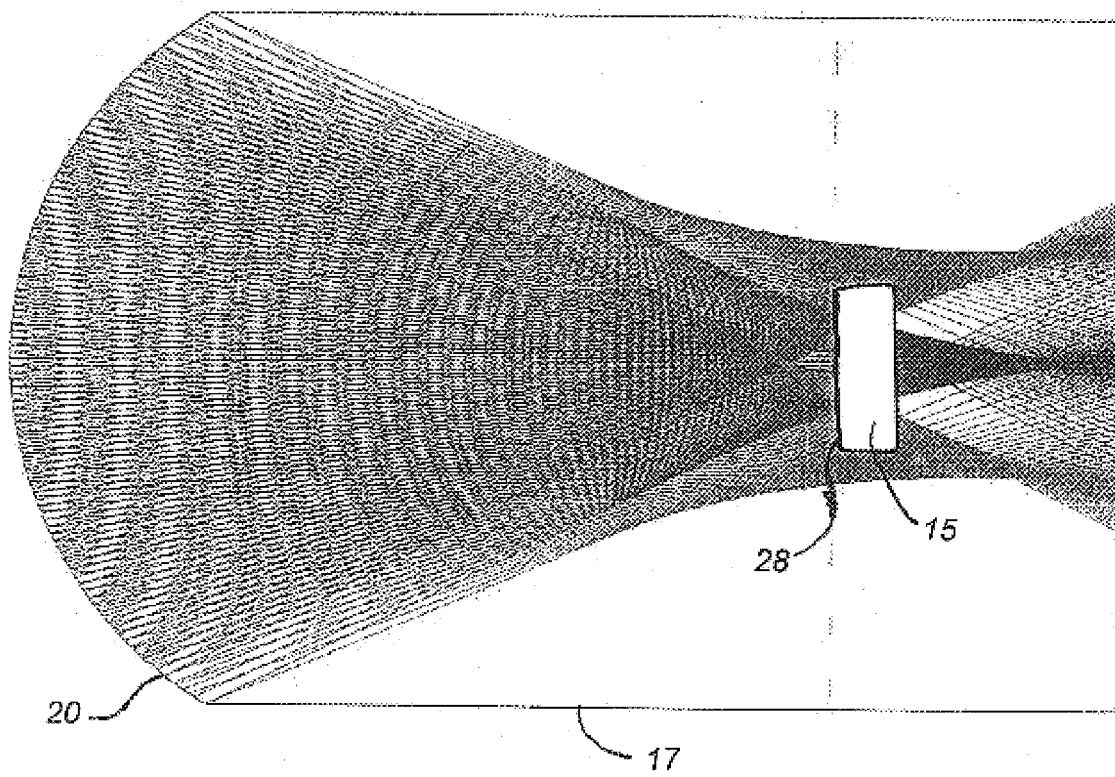

To illustrate the effect of positioning the active sensing area 28 of sensing element 15 closer to the lens than its focus point, ray tracings for two different photosensor constructions are shown in FIGS. 13A and 13B. In both the devices shown in FIGS. 13A and 13B, the integral lens/encapsulant has a length along its optical axis of 4 mm with the active sensing area 28 of sensing element 15 positioned 3 mm back from the forward-most point of the integral lens. The first photosensor device shown in FIG. 13A has an integral lens with a radius of 1.25 mm in the plane in which the cross section is taken. Light having a wavelength of 550 mm was directed at the lens with sources that were on-axis, and at +10 degrees and −10 degrees off-axis. The photosensor device shown in FIG. 13B is similar to that shown in FIG. 13A with the exception that the radius of the integral lens is 1.45 mm, thus increasing the focal length of the lens. The sensing element, however, in the second photosensor device is maintained at 3 mm from the lens. In comparing the two devices, it is apparent that in the first photosensor device shown in FIG. 13A, only the light from the on-axis source location impinges upon the active sensing area of sensing element 15. With this construction, the first photosensing device shown in FIG. 13A is essentially blind to off-axis light. The active sensing area of the sensing element 15 of the second photosensing device shown in FIG. 13B, however, has light from both the +10 degree and the −10 degree off-axis locations impinging thereupon. Accordingly, the second photosensor device shown in FIG. 13B is more sensitive to off-axis light than the photosensor device shown in FIG. 13A.

To further widen the response profile generally in all directions, diffusant may be added to the lens material in the proportion which is experimentally determined to give the desired effect, or a surface treatment such as texturing may be applied to the lens surface. Texturing of the lens surface preferably comes from replication of a mold surface, but may be created by a coating or secondary operation such as sand blasting or bombardment with some other abrasive material. With transfer molding techniques, a textured surface is often desirable, but with encap molding techniques, textured surfaces may create mold release problems. Thus, compatibility with the fabrication process should be taken into account when choosing a technique to add diffusion. In the process referred to as the encap process, plastic lens material which is in a fluid form is dispensed into pliable mold cups and the completed lead frame assemblies are lowered into the potting material. To complete the assembly, the material is cured and the finished part is withdrawn from the mold and individual parts are separated from one another. Thus, by adding diffusant to the encapsulants of the photosensors shown in FIGS. 13A and 13B, for example, the angular response profile may be increased to counter the effect of off-axis light being focused at a location spaced away from the active sensing area of the sensing element.

As will be appreciated by those skilled in the art, less diffusant need be added to the second photosensor shown in FIG. 13B than that shown in FIG. 13A based upon the fact that the sensing element is positioned from the lens at a distance less than the focal length of the lens. It will be further appreciated that the optimal amount of diffusant and the optimal positioning of the sensing element within the encapsulant will depend upon the particular application in which the photosensor is employed. In general, the appropriate distance between the lens surface and the active sensing area of the sensing element should be selected so that the photosensing device exhibits very nearly the desired field of view, and then diffusant may be added to the encapsulant to both mitigate shadowing caused by lens defects and to expand the field of view to the desired value.

Many balances between offsetting effects may be made in the overall design. In one such balance, the sensor may be placed farther from the lens and closer to the focal points generally narrowing the profile in both directions, and a controlled amount of diffusant or surface treatment may be added to then increase diffusion to widen the profiles to the desired degree. This has a particular benefit if imperfections must be tolerated in the lens surface of the sensor. When a lens is used at its focal point, light from a distant point source may be directed to the sensing surface from much of the lens surface. In such a case, even a relatively large blemish on the lens may have only a minor effect on the resulting device performance. In contrast, if the lens surface was flat rather than curved, nearly parallel rays from a distant point source which strike the sensor would all pass through an area of the surface which was approximately the same size as the active sensing area itself. With an active sensing surface which is only 100 microns in diameter, a spot or blemish on the flat surface of comparably small size could block or scatter nearly all of the light from the point source effectively creating a blind spot in the field of view of the sensor. With the bi-radial surface, if strong de-focusing is used, the situation may be much closer to the flat surface than to the focused lens example. In such cases, very small imperfections may block or scatter light from a small area source and in some instances create what are effectively blind spots in the field of view of the sensor. Moving the sensor closer to the focal points enlarges the surface area of the lens through which light from a distant small area source is focused onto the sensor and diffusant softens shadows cast by the blemishes. The two effects both serve to reduce the "blind spot" problem, and hence, allow for the use of such a small sensing element.

The lens portion 20 of the encapsulant 17 blends into the generally cylindrical portion 13 which encapsulates the part and the top of the lead frame 12. Lip 14 may be used for registration of the part in the application. The lead frame 12 has legs 180, 182, and 184, which serve to support the part and make electrical connections to it. The sensor chip 15 is bonded to leg 182 by conductive epoxy and lead wires 23 and 24 make electrical connections to legs 180 and 184, respectively. In applications, the three leads connect the part to an associated electrical circuit.

Figures 2, 3:
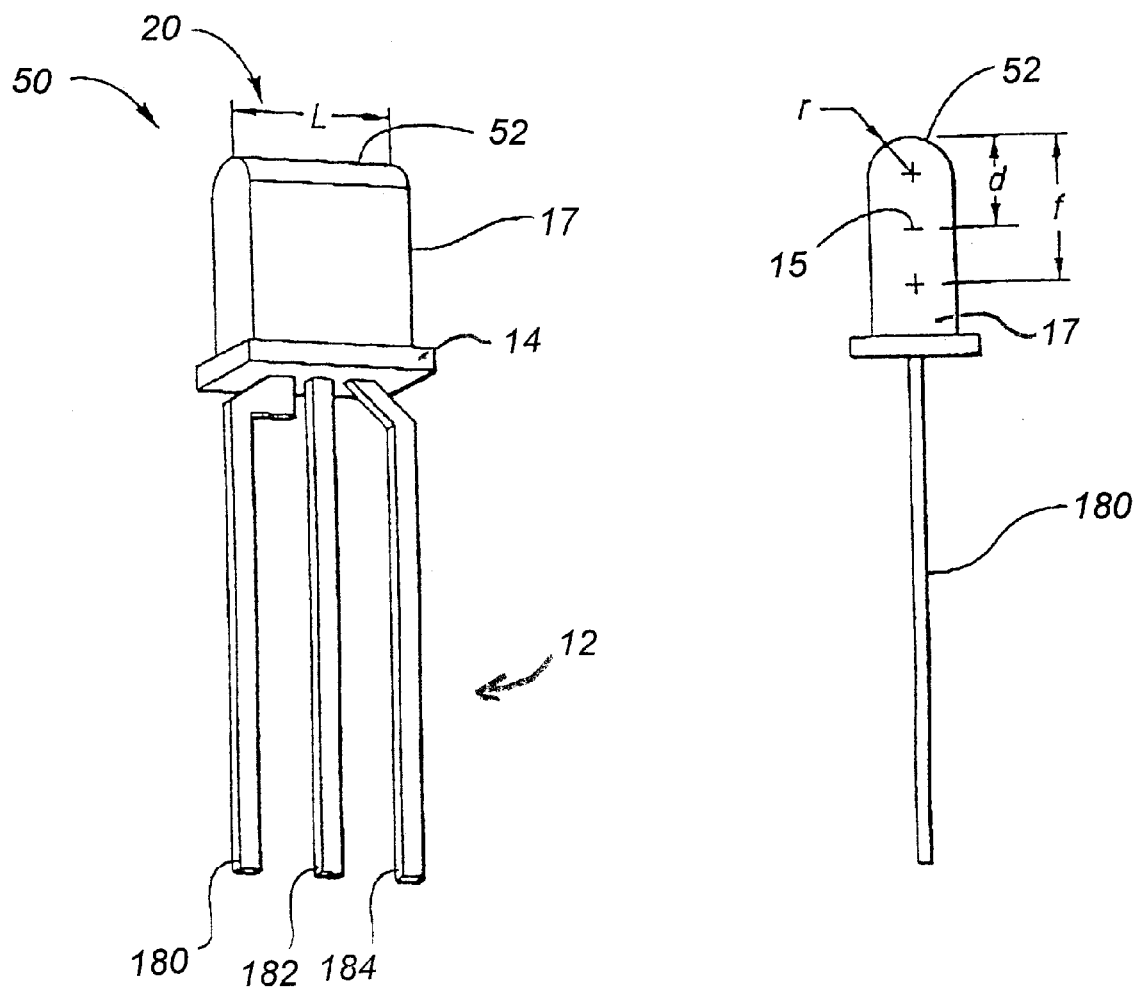
FIG. 2 is a perspective view of a sensor device constructed in accordance with a second embodiment of the present invention.
FIG. 3 is a side elevational view of the sensor device shown in FIG. 2.

FIGS. 2 and 3 illustrate a sensor device 50 constructed in accordance with a second embodiment of the present invention. As apparent from a comparison of the figures, the second embodiment differs from the first embodiment in that the integral lens 20 of the encapsulant 17 has a cylindrical surface 52 rather than a bi-radial surface. Lens 20 may have any desired radius and length, and may, for example, have a radius r (FIG. 3) of 1.25 mm and a length L of 5 mm. When mounted in a vehicle with the longitudinal axis of the cylindrical lens 20 generally normal with the horizon, horizontal compression without corresponding vertical compression is achieved. This permits observance of a wide region of the sky without sensing a correspondingly wide region of the ground, the vehicle roof, or the vehicle hood, when the sensor is used for the sky sensor. Conversely, when mounted horizontally, a wide horizontal view input is achieved. This characteristic can be advantageously used to implement a glare sensor, as described in greater detail below.

Figure 4:
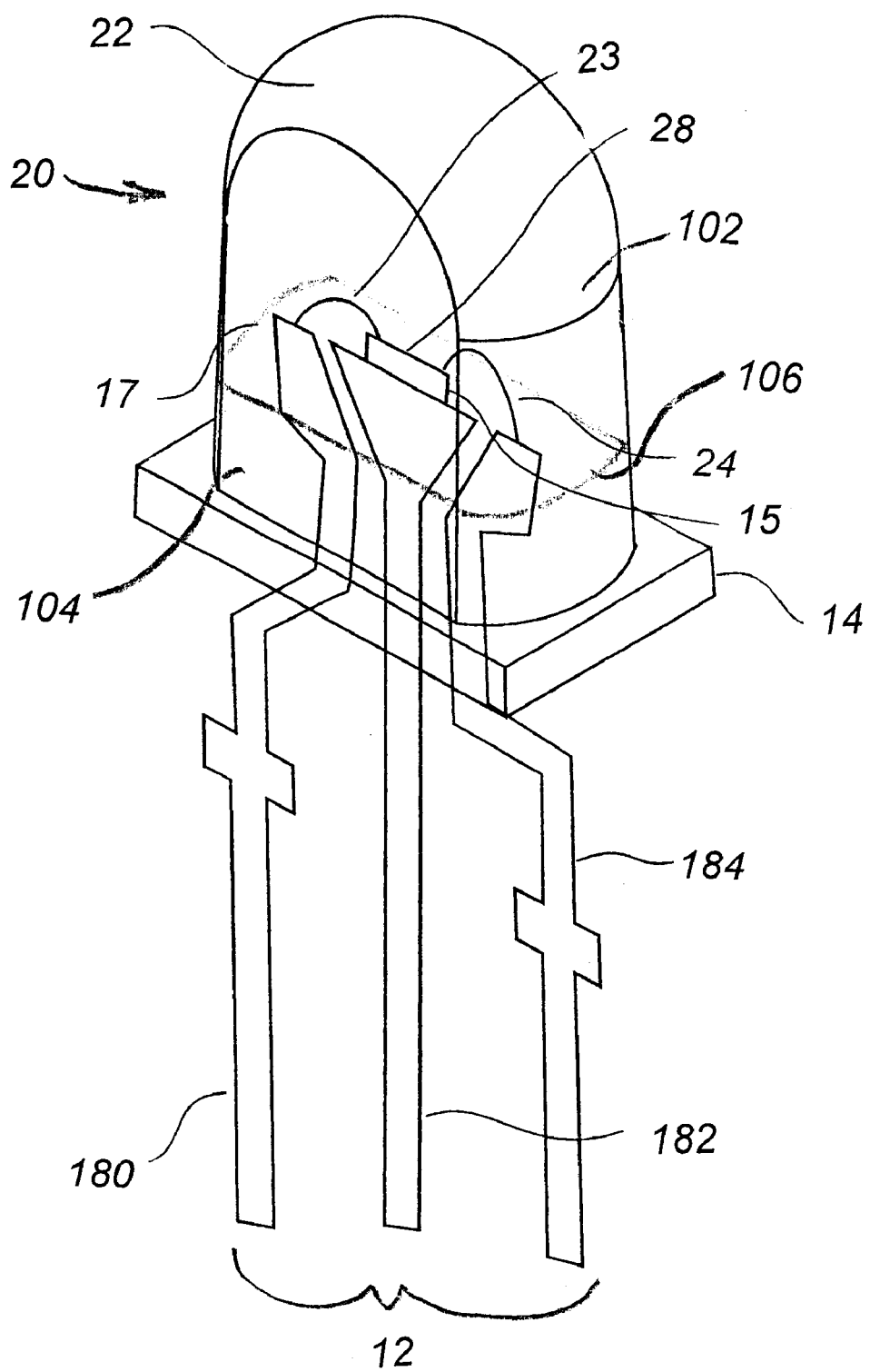
FIG. 4 is a perspective view of a sensor device constructed in accordance with a third embodiment of the present invention.

FIG. 4 illustrates a sensor device 100 constructed in accordance with a third embodiment. Sensor device 100 differs from the first and second embodiments in that the encapsulant is made of two or more different functional zones 102 and 104 with a transition region 106 between zones 102 and 104. Two separate functional zones 102 and 104 are provided based upon the recognition that different portions of an encapsulant may serve different functions from other portions of the encapsulant such that the first zone 102 may have at least one different characteristic than the second zone 104 so as to optimize performance of the function(s) to be performed by that particular zone. For example, first zone 102 should be at least partially transmissive to the wavelengths of radiation to be sensed by sensing element 15, while second zone 104 need not be transparent to such wavelengths. This allows the sensor device of the present invention to make use of the extraordinary benefits of high performance power semiconductor encapsulation and transfer-molding compounds in the second zone. These characteristics can include a relatively low coefficient of thermal expansion; relatively high thermal conductivity; relatively high $T_g$; relatively high specific heat; relatively low permeability to oxygen, gas, or water vapor; and relatively high physical strength properties. The compounds used for packaging or potting many high-power non-optical electronic devices are superior by a large margin in many of these categories to those traditionally used for conventional sensors. One of the main reasons for the disparity is that the high performance materials under discussion are usually opaque mixtures—not transparent to the band of radiation to be sensed by the sensor device. The opacity of these functionally attractive materials is intrinsically linked to their beneficial properties (by virtue of the performance-enhancing mineral, metal, and metal-oxide fillers, for example), and thus, these materials had not been previously considered for use in sensor components due to their opacity. However, by limiting the use of such materials to a zone of encapsulant 17 that does not require transparency, the present invention enjoys all the benefits of these material characteristics.

First zone 102 of encapsulant 17 is preferably a substantially transparent material to preserve optical performance. First zone 102 may optionally be partially diffused. First zone 102 may be made of any conventional transparent encapsulant commonly used for sensors or LEDs. First zone 102 of encapsulant 17 preferably covers, envelops, protects, and supports sensing element 15, the die-attach (if present), and a portion of any wire bonds 23 and 24 connected to sensing element 15.

First zone 102 of encapsulant 17 may be comprised of two or more portions, with the innermost being a silicone or silastic glob-top (not shown) preapplied to sensing element 15 prior to the first stage of molding of the encapsulant of the present invention. This innermost portion of first zone 102 may alternatively be a high performance epoxy, silicone, urethane, or other polymer material possibly including optically translucent or transparent fillers or diffusants.

First zone 102 of encapsulant 17 is preferably made of a composition comprising an optical epoxy mixture that is substantially transparent to the radiation sensed by sensing element 15. However, other clear materials may also be used, and the materials need not be transparent in bands outside the primary band of sensitivity of the sensing element 15.

Second zone 104 of encapsulant 17 is preferably made of a material that optimizes the function of that region of encapsulant 17. As noted above, second zone 104 need not be transparent. However, a specialized function of zone 104 is generally to minimize catastrophic failure, stress, and accumulated fatigue from mechanical stresses propagated up electrically conductive leads 180, 182, and 184. Not only may a material that is better suited for this purpose be selected given that it need not be transparent, but also the material may have higher strength properties, including higher tensile and compressional strength, adhesion, and/or cohesion.

Another function served by second zone 104 of encapsulant 17 is to serve as a barrier to oxygen, molecular water vapor, or other reagents that may otherwise propagate upward into the device through second zone 104 or through the interface between encapsulant 17 and leads 180, 182, and 184. Thus, second zone 104 should effectively protect sensing element 15, the die-attach (if present), wire bonds 23 and 24, the encapsulated portions of the lead frame plating, and other internal device constituents from oxygen, molecular water vapor, and other reagents. Because second zone 104 of encapsulant 17 need not be transparent, second zone 104 may be constructed with improved barrier properties compared to those present in conventional transparent encapsulants.

Second zone 104 may also have better thermal characteristics from first zone 102. To achieve lower device thermal resistance, second zone 104 preferably has a high thermal conductivity, at least in the critical region of the device surrounding electrical leads 180, 182, and 184 and in thermal coupling to the portion of the leads that supports sensing element 15. To preserve relatively high thermal resistance protection from soldering operations, the bottom portion of second zone 104 of encapsulant 17 extends no closer to the solderable portion or ends of electrically conductive leads 180, 182, and 184 than the standoffs (if present) or an equivalent point on the leads destined to remain substantially out of contact with molten solder during processing if standoffs are not present.

By forming second zone 104 of encapsulant 17 to have a high heat capacity, second zone 104 will help suppress transient temperature spikes during processing or operation. Also, by configuring second zone 104 to have a low coefficient of thermal expansion, catastrophic failure, stress, and accumulated fatigue from thermal expansion and contraction within the device are minimized.

To achieve different functional characteristics for the first and second zones 102 and 104 of encapsulant 17, the two zones may have different physical properties. Such physical properties may be structural or compositional. Such different structural characteristics may be obtained using the same general composition for both first and second zones 102 and 104 but by causing a change in grain size or micro-structural orientation within the two zones. Such structural characteristics may be modified during the molding process by treating the zones differently by annealing, radiation curing, or other radiation treatment. Further, the micro-structural orientation may be changed by applying a magnetic field to one or more of the zones forming encapsulant 17.

In the event two different compositions are utilized to form first and second zones 102 and 104, it is preferable that the material compositions are compatible for molding in the same mold, as is discussed further below with reference to the inventive process for making a preferred embodiment of the present invention. By integrally molding first and second zones 102 and 104, a cohesive bond may be formed at transition 106 between zones 102 and 104. Such a cohesive bond is desirable to improve the strength of the encapsulant as a whole and to prevent oxygen, water vapor, or other reagents from reaching sensing element 15 via any interface between zones 104 and 106 that otherwise may be present. Further, such a cohesive bond provides continuity of the outer surface. It is desirable that the compositions used for first and second zones 102 and 104 partially intermix at transition 106. Transition 106 may be a fairly narrow cross section of encapsulant 17 or may be broader and larger if a composition gradient is formed using the compositions of first and second zones 102 and 104.

An additional advantage of making second zone 104 of encapsulant 17 opaque is that it is less likely that any back-scattering from any light emitting devices mounted in the same housing or to the same circuit board may reach the sensing element 15. Such back-scattering may be a problem when a light emitting device is mounted in the same housing as sensing element 15, as is often the case when such sensor devices are mounted in an electrochromic rearview mirror assembly for an automobile. The opaque second zone 104 also serves to absorb light that enters the sensor device encapsulant and yet passes by the sensing element toward the circuit board on which the sensor device is mounted. This may be significant when other sensors are utilized in the same housing or on the same circuit board.

The base epoxy used to form second zone 104 of encapsulant 17 may be distinct from the clear lens epoxy used to form first zone 102 not only in composition, but additionally or alternatively distinct in one or more physical properties (spectral transmittance at a wavelength of interest, diffuse scattering properties at one or more wavelengths of interest, microcrystalline structure, strength, thermal conductivity, $CT_E$, $T_g$, etc.). The transition zone 106 between first zone 102 and second zone 104 may occur at a transition boundary zone, which may be narrow (effecting a more abrupt transition in properties) or broad (effecting a more gradual transition or gradient in properties). As discussed above, the distinction between lens epoxy and base epoxy may be compositional and achieved by using two different material mixtures in the manufacturing process. A narrow transition boundary zone 106 between zones 102 and 104 might then be achieved by ensuring two formulations that are substantially immiscible or by slightly or completely precuring one material before the other is added. A broad boundary zone 106 might be achieved by not precuring the first material completely prior to adding the second material and by ensuring the formulae of the two materials allow some mixing at their boundary.

In the event that a distinction desired between lens epoxy and base epoxy is not primarily a compositional distinction but rather a physical distinction, then alternate means may be used to accomplish this, if the above-noted means is insufficient. For example, material property enhancement to a compositionally identical base epoxy portion may be achieved by post-treating the base epoxy portion after dispensing into the mold. Such post-treatment may be differential heating (such as by having established a temperature gradient in the mold or by using a stratified oven or stratified heated airflow). Such pretreatment may additionally or alternatively be differential irradiation with zonal IR, UV, visible, microwave, X-ray, or other electromagnetic radiation source or by E-beam or other particle beam. Also, certain microstructural effects (grain migration, lamination, orientation, size, agglomeration, etc.) may be effected by exposing all or part of the device materials to electric fields, magnetic fields, centrifugal/centripetal forces or gravity before, during, or after dispensing.

One material suitable for first zone 102 of encapsulant 17 is HYSOL® OS4000 transparent epoxy available from Dexter Electronic Materials Division. A material suitable for first zone 102 of encapsulant 17 is HYSOL® EO0123 casting compound, which is also available from Dexter. Additional details of how such a multi-zone encapsulant may be made are disclosed in commonly assigned U.S. Pat. Ser. No. 6,521,916, entitled "RADIATION EMITTER DEVICE HAVING AN ENCAPSULANT WITH DIFFERENT ZONES OF THERMAL CONDUCTIVITY," filed by John K. Roberts et al. on Apr. 13, 2001, which discloses a similar encapsulant, but for use with an LED. The entire disclosure of this patent is incorporated herein by reference.

The sensing element 15 may be any form of photosensor device such as a photodiode, cadmium sulfide CdS cell, etc. A preferred sensing element is the photodiode disclosed in commonly assigned U.S. patent application Ser. No. 09/491,192 filed on Jan. 25, 2000, by Jon H. Bechtel et al. entitled "VEHICLE EQUIPMENT CONTROL WITH SEMICONDUCTOR LIGHT SENSOR," and U.S. patent application Ser. No. 09/307,191 filed on May 7, 1999, by Robert H. Nixon et al. entitled "PHOTODIODE LIGHT SENSOR," the entire disclosures of which are incorporated herein by reference. A brief disclosure of the structural components of the sensing element circuitry and of a processing circuit 66 that interfaces with sensing element 15 is discussed below with reference to FIGS. 5–9.

Figure 5:
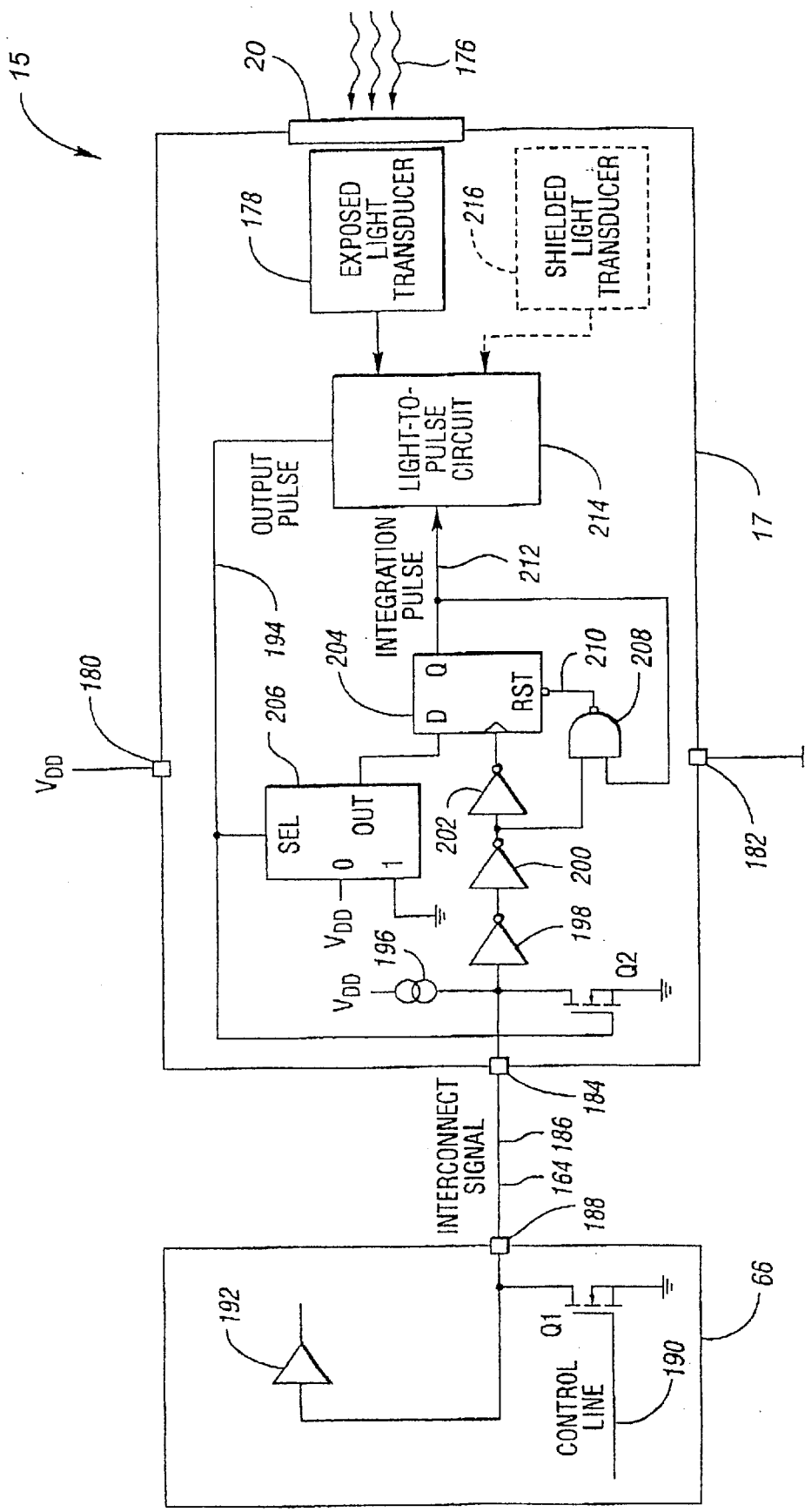
FIG. 5 is an electrical circuit diagram in block and schematic form showing circuitry permitting a processing circuit and a sensing element, which may be used in the inventive sensor device structure, to be interconnected by a single line carrying both sensitivity control and sensor output.

Referring now to FIG. 5, the processing circuit 66 and sensing element 15 will be described in greater detail. The processing circuit 66 and sensor element 15 are interconnected by a single line 164 that carries interconnect signals 186, which can advantageously include both light sensor sensitivity control signals and resultant light sensor output signals. A microcontroller may be used to implement processing circuit 66 and would include a transistor element Q1 and a buffer 192 connected to an output pin 188, or other input/output (I/O) pin structure, which is connected to signal line 164. The transistor element Q1 may be implemented using a suitable transistor such as a field effect transistor (FET) connected between signal pin 188 and ground. Transistor Q1 is controlled by control line 190, which is connected to the base of transistor Q1. Buffer 192 is also connected to signal pin 188 to isolate the signal line 164 from signal levels present in the microcontroller.

As described above, the sensor device includes an encapsulant 17 including a lens 20 for admitting light 176 incident on an exposed light transducer 178. Encapsulant 17 also admits and retains power pin 180, ground pin 182, and signal pin 184, which are preferably part of lead frame 12. The use of only three pins 180, 182, and 184 greatly reduces the cost of sensing element 15 and associated processing circuit 66.

Sensing element 15 is connected to processing circuit 66 through bus 164, which carries interconnection signal 186 between signal pin 184 in sensing element 15 and signal pin 188 in processing circuit 66. As will be described below, signal pins 184, 188 are tri-state ports permitting interconnect signal 186 to provide both an input to sensing element 15 and an output from sensing element 15.

Within sensing element 15, transistor Q2, which can be implemented using a suitable transistor such as an FET element, is connected between signal pin 184 and ground. Transistor Q2 is controlled by output pulse 194 connected to the gate of Q2. Constant current source 196 is connected to signal pin 184 so that if neither transistor Q1 nor transistor Q2 are ON (high logic level), interconnect signal 186 is pulled to a high logic level. Constant current source 196 nominally sources about 0.5 mA to pull up interconnect signal 186. The input of Schmidt trigger inverter 198 is connected to signal pin 184. Inverters 200 and 202, which are connected in series, follow Schmidt trigger inverter 198. The output of inverter 202 clocks D flip-flop 204. The output of multiplexer 206 is connected to the D input of flip-flop 204. The select input of multiplexer 206 is driven by output pulse 194 such that when output pulse 194 is asserted, the D input of flip-flop 204 is unasserted, and when output pulse 194 is not asserted, the D input of flip-flop 204 is asserted. The output of NAND gate 208 is connected to low asserting reset 210 of flip-flop 204. The output of flip-flop 204 is integration pulse 212. Integration pulse 212 and the output of inverter 200 are inputs to NAND gate 208. Light-to-pulse circuit 214 accepts integration pulse 212 and the output of exposed light transducer 178 and produces output pulse 194.

Sensing element 15 may advantageously include a shielded light transducer 216, which does not receive light 176. Shielded light transducer 216 has substantially the same construction as exposed light transducer 178, being of the same size and material as transducer 178. Light-to-pulse circuit 214 uses the output of shielded light transducer 216 to reduce the affects of noise in exposed light transducer 178.

Figure 6:
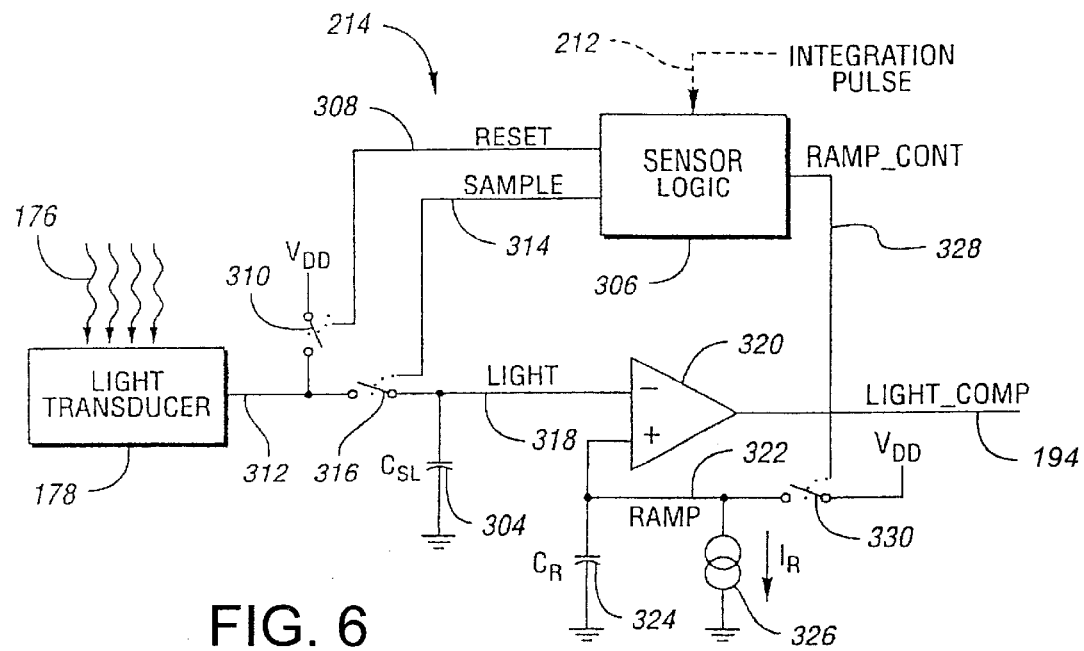
FIG. 6 is a schematic diagram of a light-to-pulse circuit for use in the sensing element shown in FIG. 5.

FIG. 6 is a schematic diagram illustrating the light-to-pulse circuit 214, which includes exposed light transducer 178 for converting light 176 incident on exposed light transducer 178 into charge accumulated in light storage capacitor 304, indicated by $C_{SL}$. Exposed light transducer 178 may be any device capable of converting light 176 into charge, such as the photogate sensor described in U.S. Pat. No. 5,471,515 entitled "ACTIVE PIXEL SENSOR WITH INTRA-PIXEL CHARGE TRANSFER" to Eric R. Fossum et al. Preferably, light transducer 178 is a photodiode such as is described below. Except, as noted, the following discussion does not depend on a particular type or construction for exposed light transducer 178.

Light-to-pulse circuit 214, which is connected to transducer 178, receives an integration pulse 212, and outputs a light comparator signal which is proportional to the amount of light 176 impacting transducer 178 during integration period pulse 212. Light-to-pulse circuit 214 operates under the control of sensor logic 306. Sensor logic 306 generates reset signal 308 controlling switch 310 connected between exposed light transducer output 312 and $V_{DD}$. Sensor logic 306 also produces sample signal 314 controlling switch 316 between exposed light transducer output 312 and light storage capacitor 304. The voltage across light storage capacitor 304, light storage capacitor voltage 318, is fed into one input of comparator 320. The other input of comparator 320 is ramp voltage 322 across ramp capacitor 324. Ramp capacitor 324 is in parallel with current source 326 generating current $I_R$. Sensor logic 306 further produces ramp control signal 328 controlling switch 330 connected between ramp voltage 322 and $V_{DD}$. Comparator 320 produces comparator output 194 based on the relative levels of light storage capacitor voltage 318 and ramp voltage 322. Sensor logic 306 may generate reset signal 308, sample signal 314, and ramp control signal 330 based on internally generated timing or on externally generated integration pulse 212.

Figure 7:
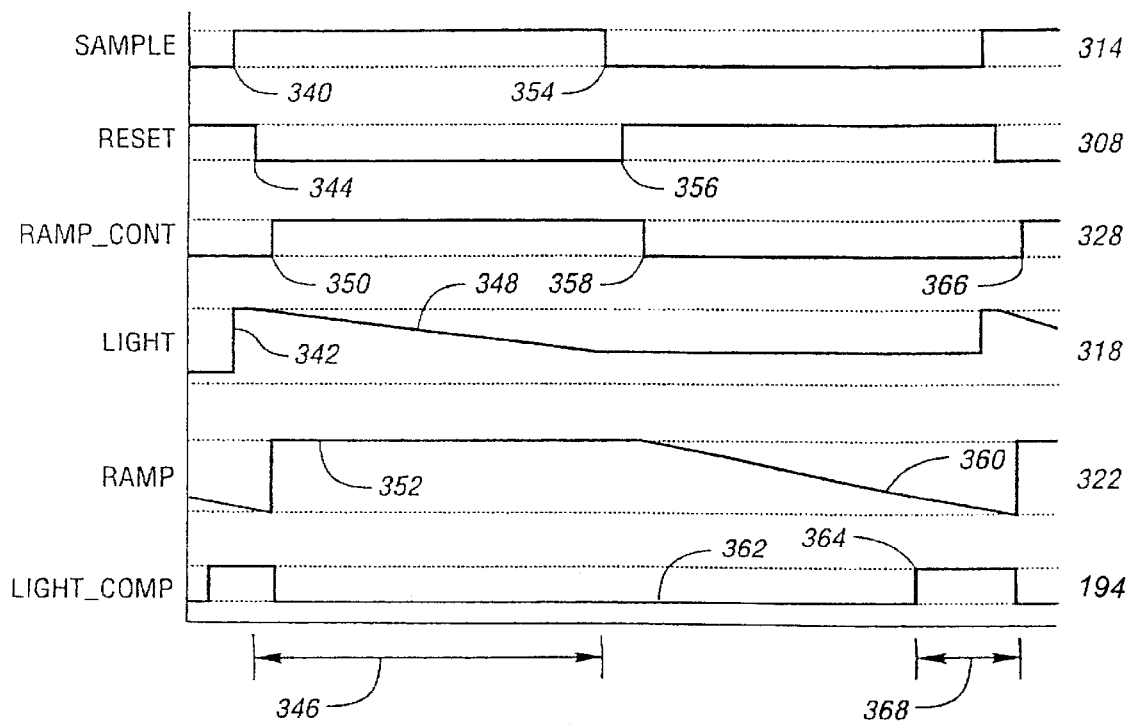
FIG. 7 is a timing diagram illustrating operation of the light-to-pulse circuit of FIG. 6.

Referring now to FIG. 7, a timing diagram illustrating operation of the light-to-pulse circuit 214 of FIG. 6 is shown. A measurement cycle is started at time 340 when sample signal 314 is asserted while reset signal 308 is asserted. This closes switch 316 to charge light storage capacitor 304 to $V_{DD}$ as indicated by voltage level 342 in light storage capacitor voltage 318. Reset signal 308 is then deasserted at time 344, opening switch 310 and beginning integration period 346. During integration period 346, light 176 incident on exposed light transducer 178 generates negative charge causing declining voltage 348 in light storage capacitor voltage 318. At time 350, ramp control signal 328 is asserted closing switch 330 and charging ramp capacitor 324 so that ramp voltage 322 is $V_{DD}$ as indicated by voltage level 352.

Sample signal 314 is deasserted at time 354, causing switch 316 to open, thereby ending integration period 346. At some time 356 following time 354 and prior to the next measurement cycle, reset signal 308 must be asserted closing switch 310. At time 358, ramp control signal 328 is deasserted opening switch 330. This causes ramp capacitor 324 to discharge at a constant rate through current source 326 as indicated by declining voltage 360 in ramp voltage 322. Initially, as indicated by voltage level 362, comparator output 332 is unasserted because ramp voltage 194 is greater than light storage capacitor voltage 318. At time 364, declining voltage 360 in ramp voltage 322 drops below light storage capacitor voltage 318 causing comparator output 194 to become asserted. Comparator output 194 remains asserted until time 366 when ramp control signal 328 is asserted closing switch 330 and pulling ramp voltage 322 to $V_{DD}$. The difference between time 366 and time 364, indicated by pulse duration 368, is inversely related to the amount of light 176 received by exposed light transducer 178 during integration period 346. The integration period 346 can be set directly by the integration pulse 212 or a signal derived from integration pulse 212. It is envisioned that the integration period 346 will be proportional to the width of the integration pulse 212, which is proportional to the pulse width of the control line signal 190 in the circuit of FIG. 5.

Figure 8:
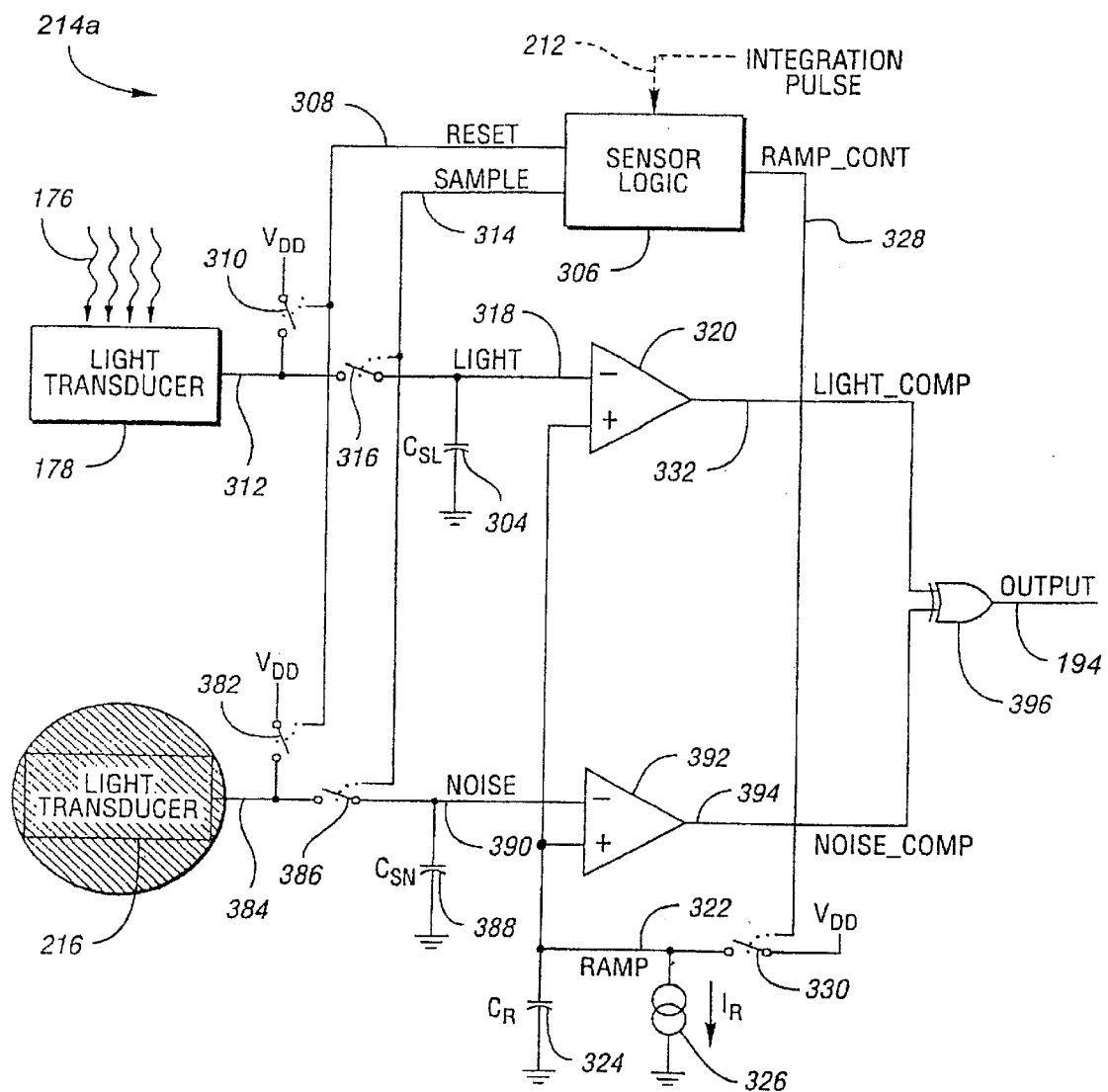
FIG. 8 is a schematic diagram of an optional light-to-pulse circuit with noise compensation for use in the sensing element shown in FIG. 5.

FIG. 8 is a schematic diagram of a modified light-to-pulse circuit 214a with noise compensation. Modified light-to-pulse circuit 214a improves upon light-to-pulse circuit 214 by incorporating shielded light transducer 216 and associated electronics. Shielded light transducer 216 preferably has the same construction as exposed light transducer 178. However, shielded light transducer 216 does not receive light 176. Charge generated by shielded light transducer 216, therefore, is only a function of noise. This noise is predominately thermal in nature. By providing shielded light transducer 216 having the same construction as exposed light transducer 178, such that the exposed and shielded transducers have the same surface area and material composition and may be deposited on the same die, the noise signal produced by shielded light transducer 216 will closely approximate the noise within the signal produced by exposed light transducer 178. By subtracting the signal produced by shielded light transducer 216 from the signal produced by exposed light transducer 178, the effect of noise in light transducer 178 can be greatly reduced.

Reset signal 308 controls switch 382 connected between shielded transducer output 384 and $V_{DD}$. Sample signal 314 controls switch 386 connected between shielded transducer output 384 and noise storage capacitor 388, indicated by $C_{SN}$. The noise storage capacitor voltage 390, which is the voltage across noise storage capacitor 388, is one input to comparator 392. The second input to comparator 392 is ramp voltage 322. The outputs of comparator 392, noise comparator output 394, and comparator output 194 serve as inputs to exclusive-OR gate 396. Exclusive-OR gate 396 generates exclusive-OR output 194 indicating the intensity of light 176.

Figure 9:
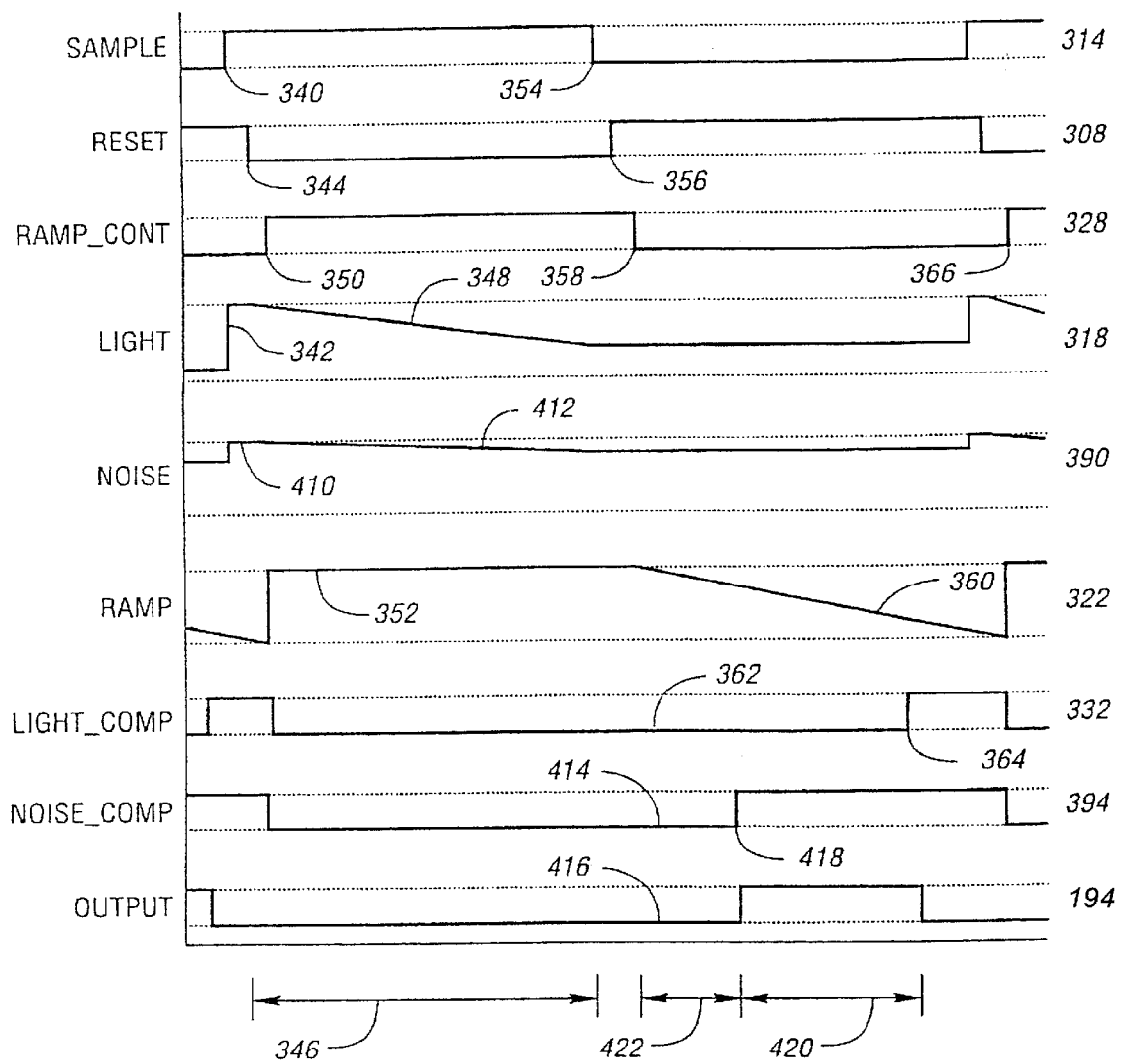
FIG. 9 is a timing diagram illustrating operation of the light-to-pulse circuit of FIG. 8.

FIG. 9 shows a timing diagram illustrating operation of the light-to-pulse circuit 214a of FIG. 8. Light-to-pulse circuit 214a functions in the same manner as light-to-pulse circuit 214 with regard to reset signal 308, sample signal 314, light storage capacitor voltage 318, ramp voltage 322, ramp control signal 328, and comparator output 194. At time 340, sample signal 314 is asserted while reset signal 308 is asserted. Switches 382 and 386 are both closed charging noise storage capacitor 388 to $V_{DD}$ as indicated by voltage level 410 in noise storage capacitor voltage 390. At time 344, reset signal 308 is deasserted opening switch 382 and causing declining voltage 412 in noise storage capacitor voltage 390 from charge produced by shielded light transducer 216 due to noise. At time 354, sample signal 314 is deasserted ending integration period 346 for noise collection. At time 358, ramp control signal 328 is deasserted causing declining voltage 360 in ramp voltage 322. Initially, as indicated by voltage level 414, noise comparator output 394 is unasserted because ramp voltage 322 is greater than noise storage capacitor voltage 390. Since comparator output 332 is also unasserted, output 194 from comparator 396 is unasserted as indicated by voltage level 416. At time 418, ramp voltage 322 drops below the level of noise storage capacitor voltage 390, causing noise comparator output 394 to become asserted. Since noise comparator output 394 and comparator output 332 are different, output 194 from comparator 396 is asserted. At time 364, ramp voltage 322 drops beneath the level of light storage capacitor voltage 318, causing comparator output 194 to become asserted. Since both noise comparator output 394 and comparator output 194 are now asserted, output 194 from exclusive-OR gate 396 now becomes unasserted. The difference between time 364 and time 418, output pulse duration 420, has a time period proportional to the intensity of light 176 incident on exposed light transducer 178 less noise produced by shielded light transducer 216 over integration period 346. The duration between time 418 and time 358, noise duration 422, is directly proportional to the amount of noise developed by shielded light transducer 216 over integration period 346. Since the majority of this noise is thermal noise, noise duration 422 is indicative of the temperature of shielded light transducer 216. At time 366, ramp control signal 328 is asserted, deasserting both noise comparator output 394 and comparator output 194.

In circuits where very high light levels may impinge on the sensor, it is preferable to include a comparator (not shown) to end the output pulse when the voltage 318 falls below a predetermined threshold. This has the effect of limiting the maximum duration 420 of the output pulse at signal 194.

Additional details of the operation of processing circuit 66, sensing element 15, and light-to-pulse circuits 214 and 214a are disclosed in the above referenced U.S. Pat. Nos. 6,379,013 and 6,359,274.

Although a specific and preferred example of a sensing element is disclosed above, the term "sensing element," as used herein, is not limited to any such structure, but rather may include a form of photosensor. Similarly, although the "support structure" is described above as being a lead frame or portion thereof, the support structure may be any structure on which a sensing element may be supported and encapsulated.

The sensor device of the present invention may be used in many of the applications in which conventional sensor devices are employed. Commonly assigned U.S. Pat. Ser. No. 6,379,013 discloses various automotive applications of such sensors, the entire disclosure of which is incorporated herein by reference.

Figure 10A:
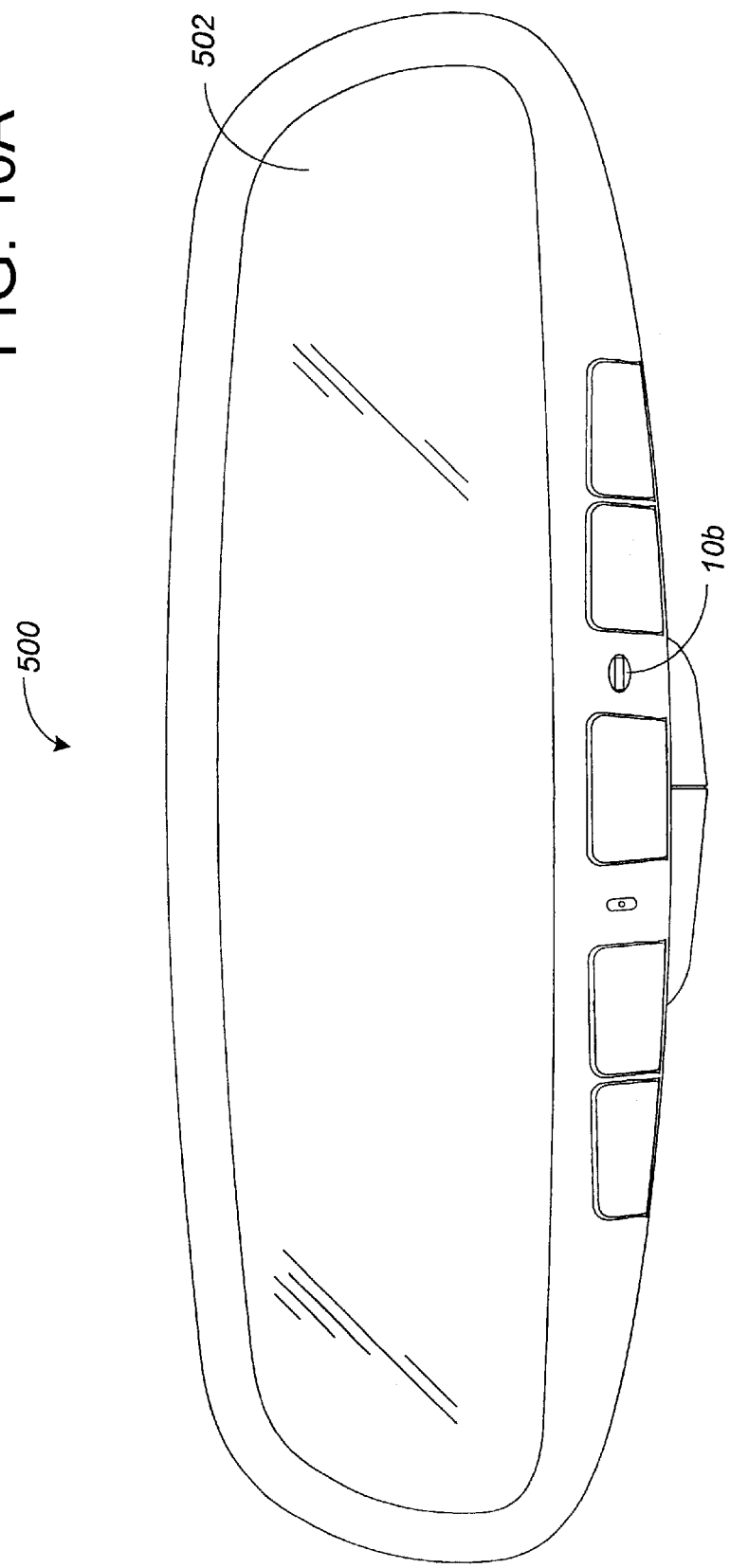
FIG. 10A is an elevational view of the front of a rearview mirror assembly incorporating the sensor device of the present invention.

FIG. 10A–10D, 11, and 12 show several such automotive applications. Specifically, a rearview mirror assembly 500 is shown in FIGS. 10A–10D, which incorporates an electrochromic rearview mirror 502 that has a reflectivity that is controlled by a processing circuit 66 (FIGS. 5 and 11) as a function of an ambient light level sensed by a forward facing ambient sensor 10a (FIG. 10B) and a rearward facing glare sensor 10b (FIG. 10A). Either one or both of sensors 10a and 10b may have any of the constructions shown in FIGS. 1–4. By utilizing a sensor having the construction shown in either of FIGS. 1–4, the horizontal field of view may be widened or narrowed relative to the vertical field of view as may be desirable for the particular sensor.

Figure 10B:
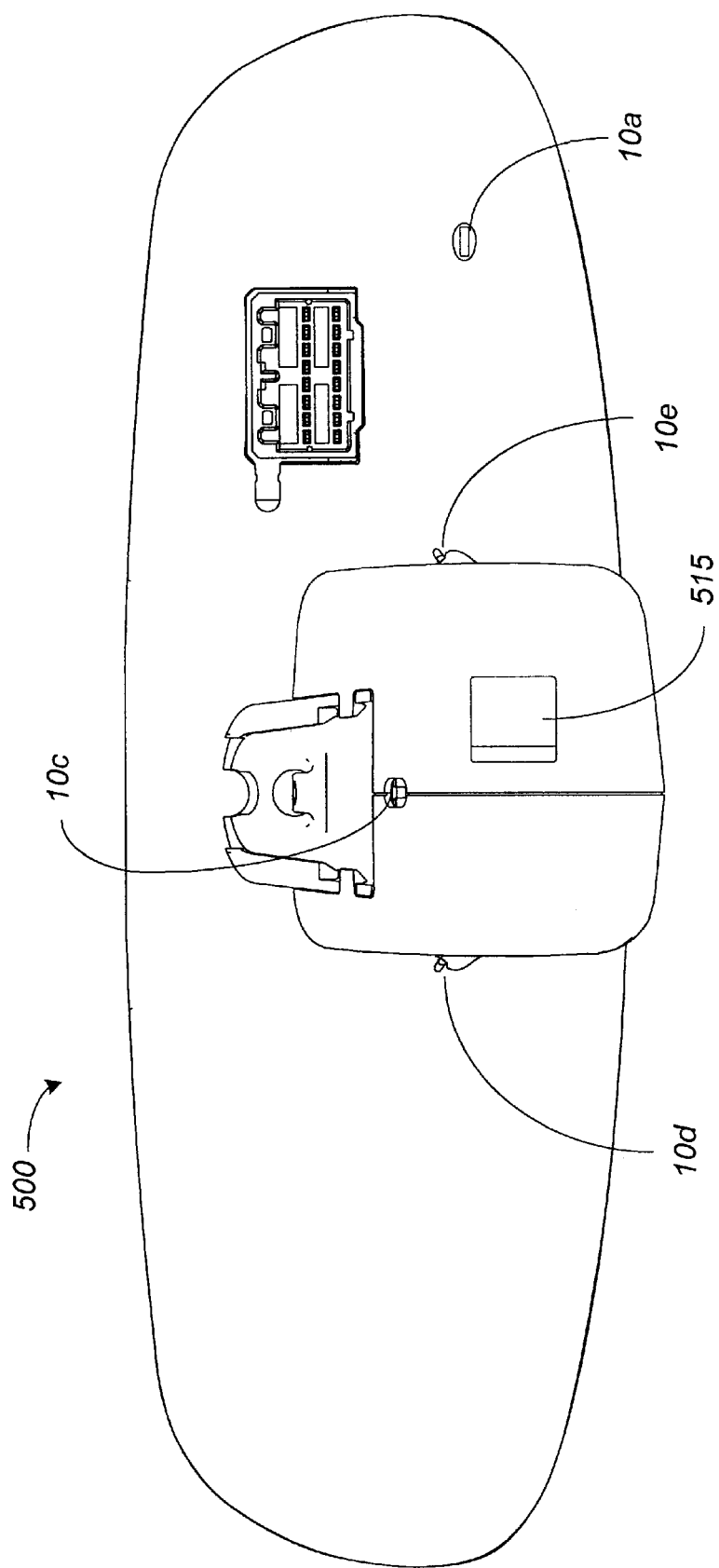
FIG. 10B is an elevational view of the rear of a rearview mirror assembly incorporating the sensor device of the present invention.
Figure 10D:
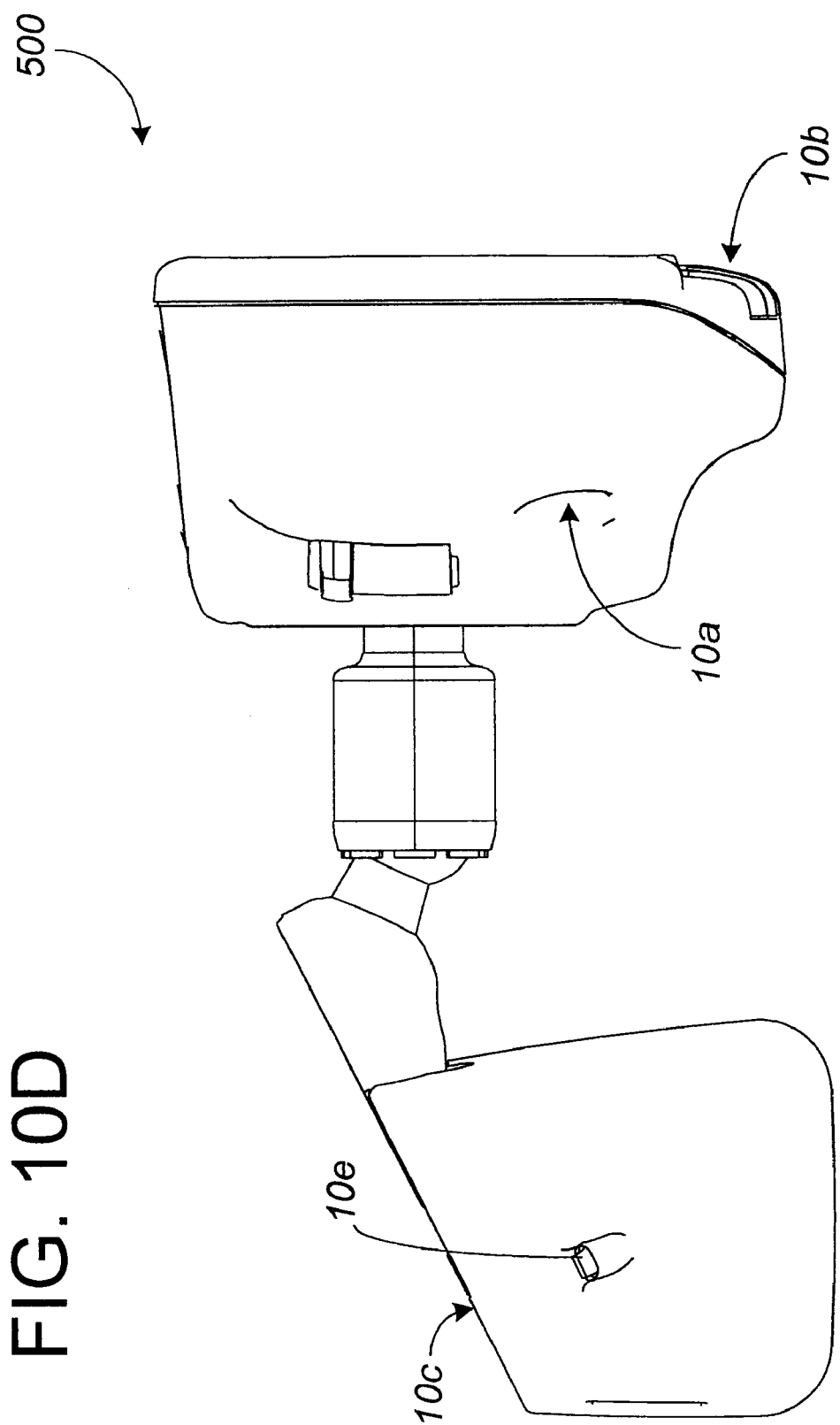
FIG. 10D is an elevational view of the side of a rearview mirror assembly incorporating the sensor device of the present invention.
Figure 11:
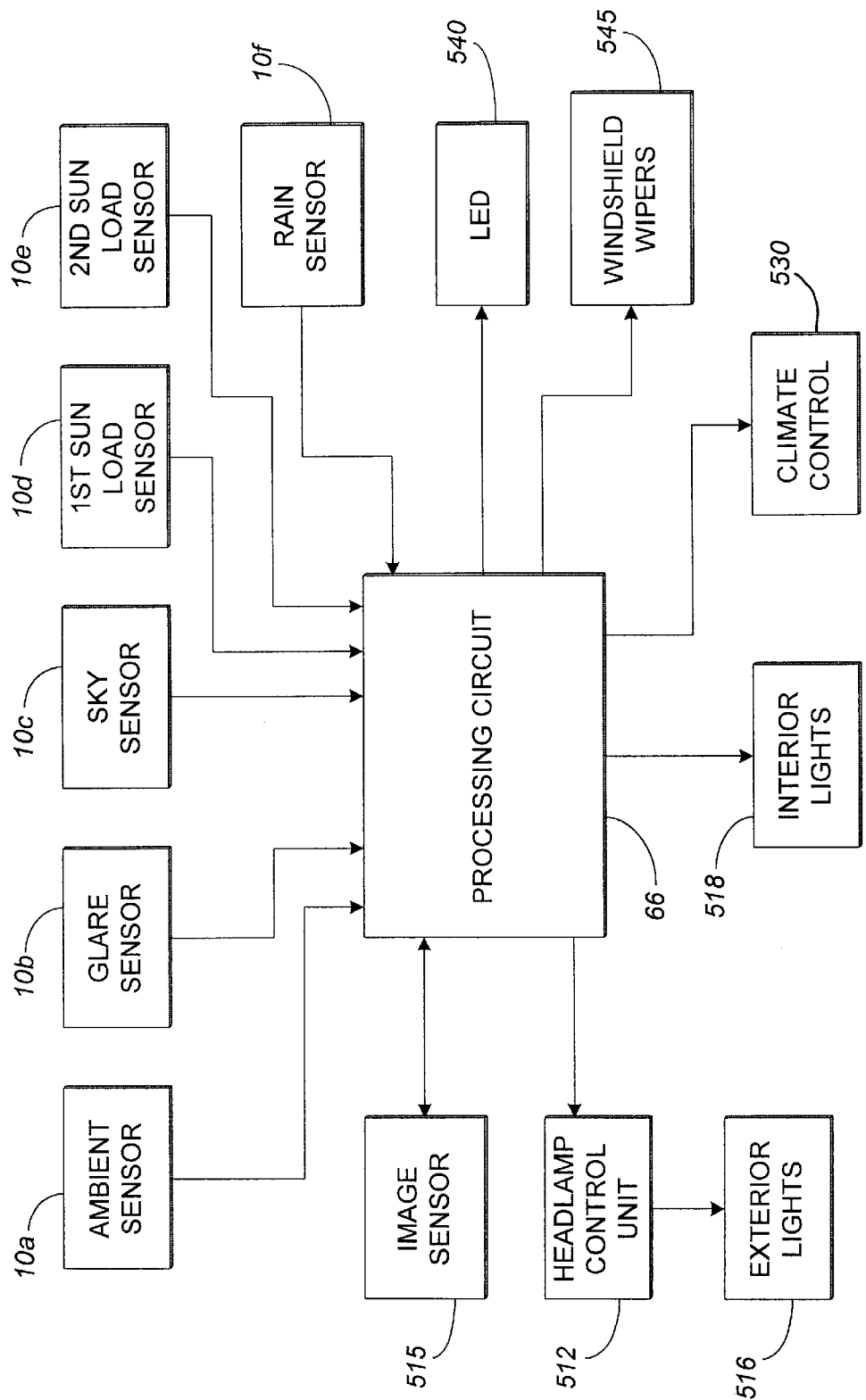
FIG. 11 is an electrical circuit diagram in block form illustrating a vehicle equipment control system employing the sensor device of the present invention.

As shown in FIGS. 10B–10D, the rearview mirror may further include a sky sensor 10c that is aimed upward at the sky. Such a sky sensor is useful in a headlamp control system for detecting tunnels and thereby ensure that headlamps are appropriately turned on when the vehicle is in a tunnel and turned off upon exiting the tunnel. Sky sensor 10c may also advantageously employ the construction shown in FIG. 1 and described above. Sky sensor 10c is coupled to a processing circuit 66 (FIGS. 5 and 11) which, in turn, may be coupled to a headlamp control unit 512 to thereby turn the vehicle headlamps on and off in response to the ambient light level and sky light level sensed by sensors 10a and 10c. The headlamp control system may further include an image sensor 515 for sensing images forward of the vehicle for purposes of controlling the brightness of the high beam headlamps and/or activating or aiming the headlamps or other exterior lights 516 to change the beam pattern produced by the exterior lights based upon light sources detected by the image sensor 515. An example of such a headlamp control system is disclosed in commonly assigned U.S. Pat. No. 6,587,573 filed on Mar. 5, 2001, entitled "SYSTEM FOR CONTROLLING EXTERIOR VEHICLE LIGHTS" filed by Joseph S. Stam et al., the entire disclosure of which is incorporated herein by reference. The output of the sensors 10a, 10b, and/or 10c may also be used to control other vehicle lights such as the interior lights 518 of the vehicle and more particularly to control the brightness of the display lights of the various displays in the instrument panel and other vehicle accessories.

As also shown in FIGS. 10B–10D, two or more additional sensors 10d and 10e may be employed to sense sun loading. Sun loading sensors 10d and 10e are aimed upward toward the sky above the vehicle and are aimed slightly to different sides of the vehicle to sense whether the sun load on one side of the vehicle is greater than on the other side of the vehicle.

A processing circuit 66 (FIGS. 5 and 11) is coupled to sun load sensors 10d and 10e and is coupled to a climate control system 530 of the vehicle for adjusting the fan speeds and/or temperature settings for respective sides of the vehicle based upon the light levels sensed by the sun load sensors 10d and 10e. Sun load sensors 10d and 10e may also be configured as described above and shown in FIGS. 1–4. The light levels sensed by any one of the above sensors may be used to control some aspect of the operation of climate control system 530. For example, sky sensor 10c and ambient sensor 10a may be used to detect an approaching tunnel to thereby cause the headlamps to turn on and the climate control to enter a recirculation mode.

Figure 12:
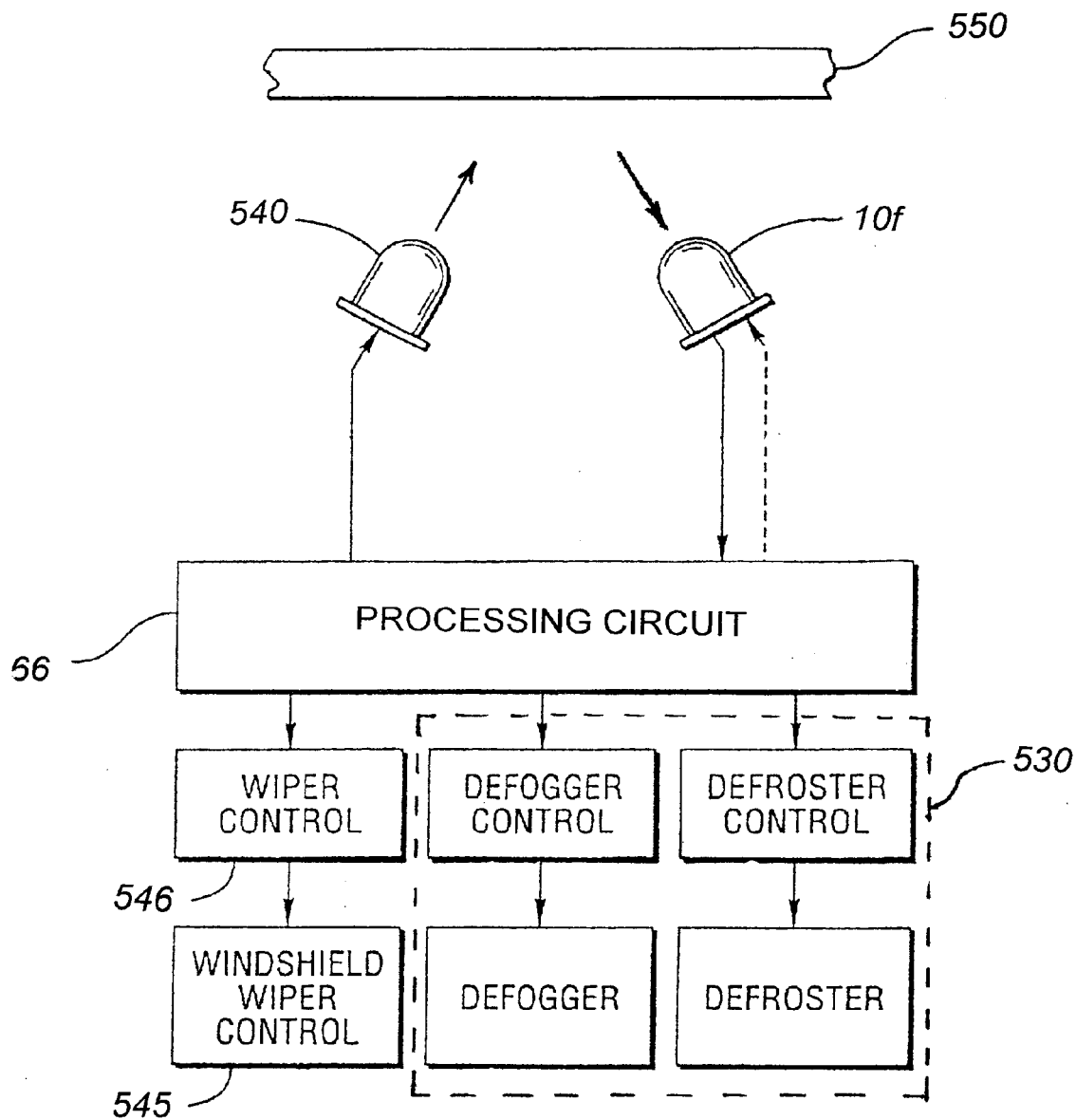
FIG. 12 is a side elevational view of a moisture detecting system employing the sensor device of the present invention.

FIG. 12 shows yet another automotive application for utilizing the inventive sensor construction. Specifically, FIG. 12 shows a moisture sensing system for detecting moisture (i.e., rain, mist, fog, frost, and snow) on the vehicle windshield. The system includes a light source such as an LED 540 and a sensor 10f. Optical radiation (i.e., visible light, or infrared or ultraviolet radiation) emitted from LED 540 enters the windshield 550 and is internally reflected therein and exits to impinge upon sensor 10f. If moisture is present on the windshield, the light from LED 540 does not reach sensor 10f and a processing circuit 66 (FIGS. 5 and 11) actuates the vehicle windshield wipers 545 via wiper control 546 and/or the windshield defogger of the vehicle climate control system 530.

While the above examples of automotive applications are described as being disposed in a rearview mirror assembly, it will be appreciated that some of the above applications may be implemented, in whole or in part, in other locations or vehicle accessories in the vehicle, such as the vehicle instrument panel, an A-pillar, a sun visor, or in an overhead console located on the headliner or on or near the windshield. Additionally, the sensor of the present invention may be employed in any other non-automotive application and the invention as broadly defined is not limited to any such application.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

What is claimed is:

1. A sensor device comprising:
   a support structure;
   a sensing element mounted on said support structure for sensing optical radiation and generating an electrical output signal in response thereto; and
   an encapsulant encapsulating said sensing element on said support structure, said encapsulant including an integral anamorphic lens.

2. The sensor device of claim 1, wherein said support structure is a portion of a lead frame.

3. The sensor device of claim 2, wherein said portion of the lead frame includes at least two leads electrically coupled to said sensing element, and wherein said leads are retained by said encapsulant.

4. The sensor device of claim 1, wherein said integral anamorphic lens is a bi-radial lens.

5. The sensor device of claim 4, wherein said bi-radial lens is a toric lens.

6. The sensor device of claim 1, wherein said integral anamorphic lens is a cylindrical lens.

7. The sensor device of claim 1, wherein said integral anamorphic lens presents different fields of view to said sensing element for transverse directions.

8. The sensor device of claim 1 and further comprising a diffusant dispersed throughout at least a portion of said encapsulant.

9. The sensor device of claim 1, wherein said sensing element is sensitive to visible light.

10. The sensor device of claim 1, wherein said integral anamorphic lens has different focal lengths for transverse directions.

11. The sensor device of claim 10, wherein a sensing area of said sensing element is positioned closer to the surface of said integral anamorphic lens than either focal length of said integral anamorphic lens.

12. The sensor device of claim 1, wherein said sensing element comprises:
   a light transducer exposed to light, the light transducer operative to accumulate charge in proportion to light incident over an integration period; and
   a sensor logic circuit in communication with the exposed light transducer, the sensor logic circuit operative to output a discrete light signal according to the accumulated exposed light transducer charge.

13. The sensor device of claim 12, wherein said integration period is variable in response to a received integration signal.

14. The sensor device of claim 12, wherein the integration period is of a length of time that is predetermined prior to accumulation of charge during the integration period.

15. The sensor device of claim 1, wherein said encapsulant has at least a first zone and a second zone, the second zone exhibiting at least one different characteristic from the first zone.

16. The sensor device of claim 1, wherein said sensing element has an active sensing area less than 1 mm$^2$.

17. A sensor device comprising:
   a support structure;
   a sensing element mounted on said support structure for sensing optical radiation and generating an electrical signal in response thereto; and
   an encapsulant encapsulating said sensing element on said support structure, said encapsulant including a surface difining an integral anamorphic lens for directing incident optical radiation towards said sensing element, said integral lens presenting different fields of view to said sensing element for transverse directions.

18. The sensor device of claim 17, wherein said lens has different focal lengths in transverse directions.

19. The sensor device of claim 17, wherein said anamorphic surface is bi-radial.

20. The sensor device of claim 19, wherein said bi-radial surface is toric.

21. The sensor device of claim 17, wherein said anamorphic surface is cylindrical.

22. The sensor device of claim 17, wherein said support structure is a lead frame having at least first and second electrical leads electrically coupled to said sensing element.

23. The sensor device of claim 22, wherein said sensing element is mounted on one of said first and second electrical leads.

24. The sensor device of claim 23 and further including a wire bond extending from one of said first and second electrical leads to said sensing element.

25. The sensor device of claim 18, wherein said sensing element has an active sensing area less than 1 mm².

26. A vehicle accessory for mounting in a vehicle, said vehicle accessory comprising:
 a sensor device comprising:
  a support structure;
  a sensing element mounted on said support structure for sensing optical radiation and generating an electrical output in response thereto; and
  an encapsulant encapsulating said sensing element on said support structure, said encapsulant including a surface difining an integral anamorphic lens.

27. The vehicle accessory of claim 26, wherein the vehicle accessory is a rearview mirror assembly.

28. The vehicle accessory of claim 27, wherein mirror is an electrochromic mirror.

29. The vehicle accessory of claim 28 and further comprising a processing circuit coupled to said sensor device for controlling said electrochromic mirror in response to light levels sensed by said sensing element.

30. The vehicle accessory of claim 29, wherein said sensor device is aimed forward of the vehicle for sensing ambient light levels.

31. The vehicle accessory of claim 29, wherein said sensor device is aimed rearward of the vehicle for sensing glare.

32. The vehicle accessory of claim 29 and further comprising a second sensor device for sensing light levels from sources in a different field of view from the first sensor device.

33. The vehicle accessory of claim 32, wherein said second sensor device comprises:
 a support structure;
 a sensing element mounted on the support structure for sensing optical radiation and generating an electrical output in response thereto; and
 an encapsulant encapsulating said sensing element on said support structure, said encapsulant including an integral anamorphic lens.

34. The vehicle accessory of claim 29, wherein said processing circuit is further configured to generate light control signals to control at least one vehicle light in response to light levels sensed by said sensing element.

35. The vehicle accessory of claim 27 and further comprising a processing circuit coupled to said sensor device for generating light control signals to control at least one vehicle light in response to light levels sensed by said sensing element.

36. The vehicle accessory of claim 26 and further comprising a processing circuit coupled to said sensor device for generating light control signals to control at least one vehicle light in response to light levels sensed by said sensing element.

37. The vehicle accessory of claim 26, wherein said at least one vehicle light includes vehicle headlamps and said processing circuit controls the on/off state of the vehicle headlamps.

38. The vehicle accessory of claim 36, wherein said at least one vehicle light includes interior display lights.

39. The vehicle accessory of claim 26 and further comprising a processing circuit coupled to said sensor device for generating windshield wiper control signals to control windshield wipers of the vehicle in response to light levels sensed by said sensing element.

40. The vehicle accessory of claim 26 and further comprising a processing circuit coupled to said sensor device for generating climate control signals to control a climate control system of the vehicle in response to light levels sensed by said sensing element.

41. The vehicle accessory of claim 40, wherein said sensor device is positioned to sense sun loading on the vehicle.

42. The vehicle accessory of claim 26, wherein said sensing element has an active sensing area of less than 1 mm².

43. A sensor device comprising:
 a support structure;
 a sensing element mounted on said support structure for sensing optical radiation and generating an electrical output in response thereto; and
 an encapsulant encapsulating said sensing element on said support structure, said encapsulant including a surface defining an integral anamorphic lens for directing incident optical radiation toward said sensing element,
 wherein said sensing element has an active sensing area of less than 1 mm².

44. The sensor device of claim 43, wherein said lens has different focal lengths for transverse directions.

45. The sensor device of claim 43, wherein said support structure is a lead frame.

46. A sensor device comprising:
 a support structure;
 a sensing element mounted on said support structure for sensing optical radiation and generating an electrical output in response thereto; and
 an integral encapsulant configured to encapsulate said sensing element on said support structure, said encapsulant having at least a first zone and a second zone, the second zone exhibiting at least one different characteristic from the first zone, wherein said encapsulant includes a surface defining an integral anamorphic lens for directing incident optical radiation toward said sensing element.

47. The sensor device of claim 46, wherein said at least one different characteristic is a physical characteristic.

48. The sensor device of claim 46, wherein said at least one different characteristic is an optical characteristic.

49. The sensor device of claim 48, wherein said at least one different optical characteristic is transparency.

50. The sensor device of claim 48, wherein said at least one different optical characteristic is diffusivity.

51. The sensor device of claim 46, wherein said at least one different characteristic is a thermal characteristic.

52. The sensor device of claim 46, wherein said at least one different characteristic is a structural characteristic.

53. The sensor device of claim 52, wherein said at least one different characteristic includes at least one of tensile strength and compression strength.

54. The sensor device of claim 46, wherein said at least one different characteristic is a compositional characteristic.

55. The sensor device of claim 46, wherein the at least one different characteristic includes at least one of the following: mechanical strength, thermal conductivity, thermal capacity, specific heat, coefficient of thermal expansion, adhesion, oxygen impermeability, moisture impermeability, and transmittance for radiation emitted from said radiation emitter.

56. The sensor device of claim 46, wherein a region of said first zone of said encapsulant is configured to function as a lens.

57. The sensor device of claim 46, wherein said second zone of said encapsulant is configured to retain electrical leads of said support structure.

58. The sensor device of claim 46, wherein said first zone of said encapsulant is optically transparent and extends from said sensing element to a light input surface of said encapsulant.

59. The sensor device of claim 46, wherein said second zone has a lower thermal resistance than said first zone.

60. The sensor device of claim 46, wherein said second zone has a higher thermal capacity than said first zone.

61. The sensor device of claim 46, wherein said second zone has a greater mechanical strength than said first zone.

62. The sensor device of claim 46, wherein said second zone has a lower coefficient of thermal expansion than said first zone.

63. The sensor device of claim 46, wherein said second zone has a greater adhesion strength than said first zone.

64. The sensor device of claim 46, wherein said second zone has lower oxygen permeability than said first zone.

65. The sensor device of claim 46, wherein said second zone has lower moisture permeability than said first zone.

66. The sensor device of claim 46, wherein said sensing element has an active sensing area of less than 1 $mm^2$.

* * * * *

UNITED STATES PATENT AND TRADEMARK OFFICE
CERTIFICATE OF CORRECTION

| | | |
|---|---|---|
| PATENT NO. | : 6,679,608 B2 | Page 1 of 1 |
| APPLICATION NO. | : 10/043977 | |
| DATED | : January 20, 2004 | |
| INVENTOR(S) | : Jon H. Bechtel et al. | |

It is certified that error appears in the above-identified patent and that said Letters Patent is hereby corrected as shown below:

On the Title Page, Item (75), in the Inventors section, add "Joseph S. Stam".

On the Title Page, Item (57), Abstract, line 2, "include" should be --includes--.

Column 10, line 29, delete "Ser.".

Column 10, lines 38-39, "patent application Ser. No. 09/491,192" should be --Patent No. 6,379,013--.

Column 10, lines 41-42, "patent application Ser. No. 09/307,191" should be --Patent No. 6,359,274--.

Column 11, line 44, "affects" should be --effects--.

Column 14, line 16, delete "Ser.".

Column 14, line 20, "Fig." should be --Figs.--.

Column 15, line 56, after "including" insert --a surface defining--.

Column 16, line 47, "difining" should be --defining--.

Column 17, line 1, "claim 18" should be --claim 17--.

Column 17, line 12, "difining" should be --defining--.

Column 17, line 15, after "wherein" insert --the--.

Column 17, line 54, "claim 26" should be --claim 36--.

Signed and Sealed this

Twenty-second Day of June, 2010

David J. Kappos
*Director of the United States Patent and Trademark Office*